US012072626B2

(12) United States Patent
Clark et al.

(10) Patent No.: US 12,072,626 B2
(45) Date of Patent: Aug. 27, 2024

(54) ORGANOMETALLIC RADIATION PATTERNABLE COATINGS WITH LOW DEFECTIVITY AND CORRESPONDING METHODS

(71) Applicant: Inpria Corporation, Corvallis, OR (US)

(72) Inventors: Benjamin L. Clark, Corvallis, OR (US); Gaetano Giordano, Ixelles (BE); Shu-Hao L. Chang, Leuven (BE); Dominick Smiddy, Corvallis, OR (US); Mark Geniza, Corvallis, OR (US); Craig M. Gates, Corvallis, OR (US); Jan Doise, Leuven (BE); Peter de Schepper, Wijnegem (BE)

(73) Assignee: Inpria Corporation, Corvallis, OR (US)

(*) Notice: Subject to any disclaimer, the term of this patent is extended or adjusted under 35 U.S.C. 154(b) by 370 days.

(21) Appl. No.: 17/180,500

(22) Filed: Feb. 19, 2021

(65) Prior Publication Data

US 2022/0269169 A1    Aug. 25, 2022

(51) Int. Cl.
*G03F 7/004* (2006.01)
*G03F 7/16* (2006.01)

(52) U.S. Cl.
CPC ............ *G03F 7/0042* (2013.01); *G03F 7/162* (2013.01); *G03F 7/168* (2013.01)

(58) Field of Classification Search
CPC ........ G03F 7/0042; G03F 7/16; G03F 7/0012; G03F 7/168; G03F 7/162; H01L 21/0274
See application file for complete search history.

(56) References Cited

U.S. PATENT DOCUMENTS

| 5,980,978 A | 11/1999 | Jones et al. |
| 7,321,048 B2 | 1/2008 | Shenai-Katkhate et al. |

(Continued)

FOREIGN PATENT DOCUMENTS

| DE | 3109309 A1 | 9/1982 |
| EP | 3564751 A1 | 11/2019 |

(Continued)

OTHER PUBLICATIONS

Clark et al., "Coater/developer process integration of metal oxide based photoresist", Proceedings of SPIE, IEEE, vol. 9425, (Mar. 23, 2015).

(Continued)

*Primary Examiner* — Sean M DeGuire
*Assistant Examiner* — Andrew Preston Traywick
(74) *Attorney, Agent, or Firm* — Christensen, Fonder, Dardi PLLC; Diane E. Bennett; Peter S. Dardi

(57) ABSTRACT

In the context of forming radiation patternable structures especially for EUV patterning, wafer structures are described comprising a substrate having a smooth top surface and a radiation sensitive organometallic coating having an average thickness of no more than 100 nm and no more than about 1 defect per square centimeter with a defect size of greater than 48 nm, evaluated with a 3 mm edge exclusion. Corresponding methods for forming a low defect coating comprise spin coating a purified radiation sensitive organometallic resist solution onto a wafer using a spin coater system comprising a delivery line and a delivery nozzle connected to the delivery line to form a coated wafer, and drying the coated wafer to form a radiation sensitive organometallic coating having no more than about 1 defect per square centimeter with a defect size of greater than 48 nm, evaluated with a 3 mm edge exclusion. Methods are (Continued)

provided for improved filtering for particle removal from radiation patternable organometallic resist compositions.

20 Claims, 4 Drawing Sheets

(56) References Cited

U.S. PATENT DOCUMENTS

| | | | |
|---|---|---|---|
| 7,842,828 | B2 | 11/2010 | Bijanto et al. |
| 8,198,352 | B2 | 6/2012 | Deelman et al. |
| 8,278,470 | B2 | 10/2012 | Yanagihara et al. |
| 8,633,330 | B2 | 1/2014 | Merz, III et al. |
| 9,310,684 | B2 | 4/2016 | Meyers et al. |
| 9,372,402 | B2 | 6/2016 | Freedman et al. |
| 9,745,450 | B2 | 8/2017 | Frenkel et al. |
| 10,228,618 | B2 | 3/2019 | Meyers et al. |
| 10,603,696 | B2 | 3/2020 | Ogihara et al. |
| 10,864,530 | B2 | 12/2020 | Wang et al. |
| 2002/0076495 | A1 | 6/2002 | Maloney et al. |
| 2007/0207529 | A1 | 9/2007 | Kulkarni et al. |
| 2009/0191720 | A1 | 7/2009 | Nakagawa |
| 2010/0151126 | A1 | 6/2010 | Iseki et al. |
| 2014/0083557 | A1 | 3/2014 | George et al. |
| 2015/0331322 | A1* | 11/2015 | Carcasi ............... G03F 7/162 222/1 |
| 2016/0116839 | A1* | 4/2016 | Meyers ............... G03F 7/325 430/326 |
| 2016/0300706 | A1 | 10/2016 | Ogihara et al. |
| 2017/0102612 | A1* | 4/2017 | Meyers ............... G03F 7/0042 |
| 2017/0334935 | A1 | 11/2017 | Pieper et al. |
| 2019/0310552 | A1* | 10/2019 | Asano ............... G03F 7/20 |
| 2019/0315782 | A1* | 10/2019 | Edson ............... C07F 7/2284 |
| 2020/0035517 | A1 | 1/2020 | Hidaka et al. |
| 2020/0239498 | A1* | 7/2020 | Clark ............... G03F 7/0042 |
| 2020/0241413 | A1* | 7/2020 | Clark ............... G03F 7/0042 |
| 2020/0326627 | A1 | 10/2020 | Jiang et al. |

FOREIGN PATENT DOCUMENTS

| | | |
|---|---|---|
| JP | 2010-094583 A | 4/2010 |
| JP | 58-64248 A | 7/2013 |
| JP | 2018-502173 A | 1/2018 |
| JP | 2019-500490 A | 1/2019 |
| KR | 10-2018-0054917 A | 5/2018 |
| WO | 2017-163922 A1 | 9/2017 |
| WO | 2017-164018 A | 11/2018 |
| WO | 2018-142888 A1 | 12/2019 |
| WO | 2021-007262 A1 | 1/2021 |
| WO | 2023-245047 A1 | 12/2023 |

OTHER PUBLICATIONS

Pauli et al., "Importance of Purity Evaluation and the Potential of Quantitative 1H NMR as a Purity Assay" Journal of Medicinal Chemistry (2014) vol. 57, pp. 9220-9231.
Stowers et al., "Directly Patterned Inorganic Hardmask for EUV Lithography", Extreme Ultraviolet (EUV) Lithography II, vol. 7969 No. 1, p. 1-11, (Mar. 17, 2011).
Weber et al., "Method development in quantitative NMR towards metrologically traceable organic certified reference materials used as 31P qNMR standards", Anal Bioanal Chem (2015), 407:3115-3126.
Search Report from corresponding European Patent Application No. 22156725.8 dated Aug. 2, 2022.

* cited by examiner

ORGANOMETALLIC RADIATION PATTERNABLE COATINGS WITH LOW DEFECTIVITY AND CORRESPONDING METHODS

FIELD OF THE INVENTION

The invention relates to monoalkyl tin compositions, specifically monoalkyl tin trialkoxides and monoalkyl tin triamides that have been coated to form a radiation patternable coating with low defect numbers. The precursor compositions can be processed to have low metal contamination and/or low particle contamination.

BACKGROUND OF THE INVENTION

Solutions of organometallic compounds form coatings containing radiation sensitive metal-carbon bonds that can be used to pattern structures lithographically. The processing of semiconductor materials and devices with ever shrinking dimensions results in demands for high-purity solutions with low particle counts to mitigate contamination issues, minimize pattern defects, and enable the advantages of organometallic photoresists. The processing and performance of semiconductor materials for microelectronics applications can be sensitive to metal contaminants. To produce microelectronic products using lithography, the proper control of metal contaminants can reduce waste from failure to meet product specifications.

SUMMARY OF THE INVENTION

In a first aspect, the invention pertains to a wafer structure comprising a substrate having a smooth top surface and a radiation sensitive organometallic coating having an average thickness of no more than 100 nm and no more than about 1 defect per square centimeter with a defect size of greater than 48 nm, evaluated with a 3 mm edge exclusion.

In a further aspect, the invention pertains to a method for forming a low defect coating, the method comprises spin coating a purified radiation sensitive organometallic resist solution onto a wafer using a spin coater system comprising a delivery line and a delivery nozzle connected to the delivery line to form a coated wafer, and drying the coated wafer to form a radiation sensitive organometallic coating having no more than about 1 defect per square centimeter with a defect size of greater than 48 nm, evaluated with a 3 mm edge exclusion. Generally, the organometallic resist solution has a tin concentration from about 0.01M to about 0.25M and has been filtered to contain no more than about 10 particles per mL with a particle size of at least about 70 nm and is delivered from a container connected to the delivery line, in which particle impurities are measured in a closed filtration system under conditions with substantially no air bubbles. In addition, the delivery of the organometallic resist solution can be performed under conditions to limit water contact between the container and the delivery nozzle.

In an additional aspect, the invention pertains to an apparatus for removing particles from an organometallic resist composition, the apparatus comprising:
 a. a first flow loop comprising a mixing container with an inlet and an outlet, a first impeller style pump, a first filter, and tubing connecting the elements in a closed loop configured for the first impeller style pump to direct flow through the first filter to remove particulate contaminants along a path from the inlet to the outlet;
 b. a second flow loop comprising a mixing container with an inlet and an outlet, a second impeller style pump, a second filter, and tubing connecting the elements in a closed loop configured for the second impeller style pump to direct flow through the second filter to remove particulate contaminants along a path from the inlet to the outlet;
 c. a connecting line comprising a valve and flow tubes configured to provide flow between the first flow loop and the second flow loop;
 d. a dispensing line connected to the second flow loop comprising a valve and flow tubes configured to dispense filtered resist composition from the second flow loop within a clean room.

In an additional aspect, the invention pertains to a n apparatus for removing particles from an organometallic resist composition, the apparatus comprising:
 a. a first flow loop comprising a mixing container with an inlet and an outlet, a first impeller style pump, a first filter, and tubing connecting the elements in a closed loop configured for the first impeller style pump to direct flow through the first filter to remove particulate contaminants along a path from the inlet to the outlet;
 b. a second flow loop comprising a mixing container with an inlet and an outlet, a second impeller style pump, a second filter, and tubing connecting the elements in a closed loop configured for the second impeller style pump to direct flow through the second filter to remove particulate contaminants along a path from the inlet to the outlet;
 c. a connecting line comprising a valve and flow tubes configured to provide flow between the first flow loop and the second flow loop;
 d. a dispensing line connected to the second flow loop comprising a valve and flow tubes configured to dispense filtered resist composition from the second flow loop within a clean room.

In other aspects, the invention pertains to a composition comprising a solvent and an organo tin composition with a tin concentration from about 0.005M to about 0.5M and having no more than about 4 particles per mL with a particle size of at least about 70 nm, as measured in a closed system substantially free of air bubbles.

DETAILED DESCRIPTION OF THE INVENTION

Figure 1:
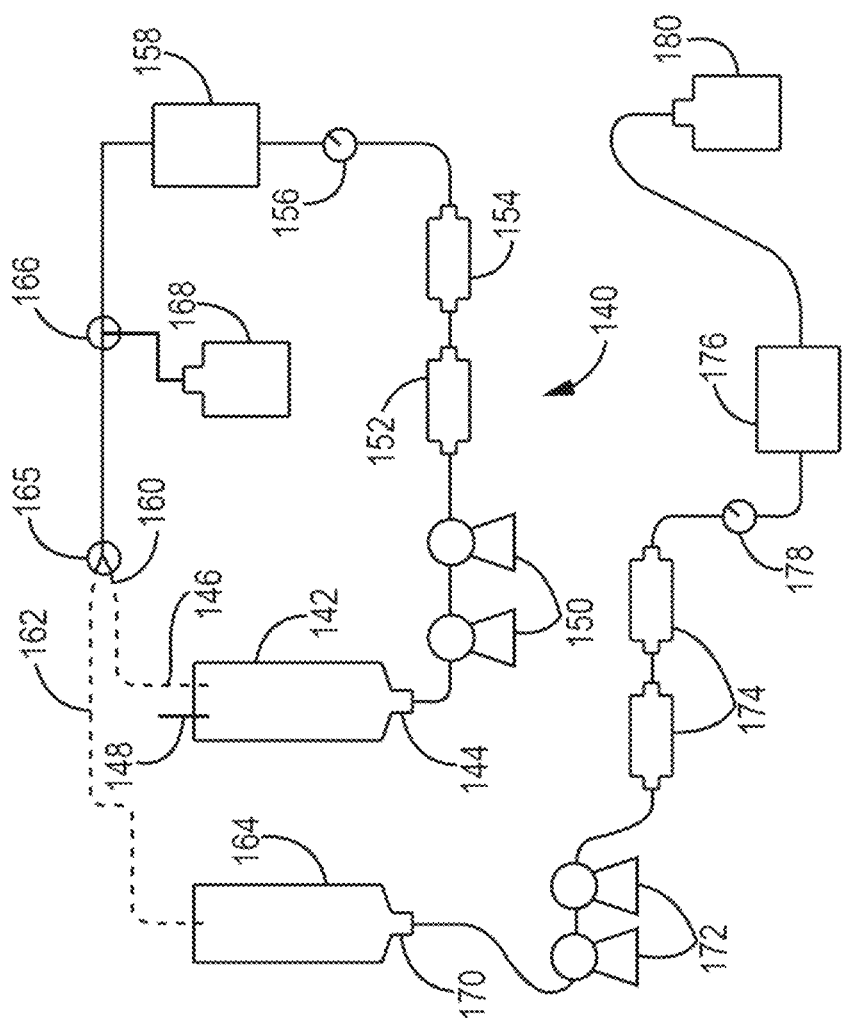
FIG. 1 is a schematic of a filtration apparatus suitable for removal of fine particulates from organo tin compositions.

Radiation patternable organometallic coatings are formed with very low numbers of defects using spin coating to provide for high resolution patterning with high yield of wafer within specific specifications. The reduction of defects in the coatings of the resist composition provides for lower incidence of defective components formed by the patterning processes, which generally involve various combinations of patterning, development, etching, deposition, and the like. The present work builds on processing to reduce particulates in the precursor solutions through the introduction of process controls along the production pipeline. Specifically, improved particle removal during resist manufacturing and storage can translate into fewer defects following coating formation. Also, during the coating process, the coating lines should be properly primed for resist delivery, and the resist delivery should be controlled to reduce water migration to the resist during transport within the coating apparatus. Particularly desirable radiation patternable organometallic resists are based on organo tin oxide hydroxide chemistry, and coating compositions can be hydrolysable compositions that form coatings of the oxide hydroxide materials for patterning. The tin-based resists have been found to be highly effective for EUV patterning with high contrast to allow for the formation of extremely fine features. Extensive development around these materials has provided for the production of commercially suitable resist materials.

Semiconductor manufacturing generally entails the execution of many successive and iterative processes to form specific structures and features on a substrate. Defects in the structures and features that are formed early on in a manufacturing process can be carried through to subsequent processes. Thus, it can be desirable to reduce the formation of defects at any point in the processing of semiconductor devices in order to increase the fidelity of the desired features and to therefore improve device yield.

Photoresists serve an integral role in the fabrication of semiconductor devices. In order to ultimately form desired features and structures on a substrate, a lithographic process is performed where an initial pattern is first formed in the photoresist layer that is then transferred into the substrate through iterative deposition and etching processes. This overall process is repeated until a desired device structure is achieved. It is therefore desirable for a deposited layer of photoresist to be smooth, continuous, and homogenous, i.e., to have fewer defects.

Similarly, it is desirable for a photoresist to faithfully reproduce the selected pattern of radiation with as few defects as possible. For example, if a defect is present within the deposited photoresist coating, then it is possible that the aerial pattern of radiation will not be faithfully transferred into a latent image having the desired spatial distribution of differential solubility to recreate the desired physical pattern in the resist. If such defects are present in the initial resist pattern, it is possible that they will be transferred as defects into intermediate or the ultimate devices, and therefore result in a reduced overall device yield.

Furthermore, for patterns of lines and spaces, some examples of patterned defect modes are microbridging, where two adjacent features are unintentionally connected by material that was intended to be removed, and line breaks, where material is missing from a line. Patterned defects can result from a variety of different sources, but it is important from a material standpoint to ensure that the photoresist can reproduce the intended pattern with high fidelity. If such defects are present in the initial resist pattern, it is possible that they will be transferred as defects into intermediate or the ultimate devices, and therefore result in a reduced overall device yield.

For the formation of integrated circuits and other devices based on wafer patterning techniques, components are generally patterned on a grid. After processing, the patterned wafer is diced to form individual components. Due to the short wavelengths, EUV processing allows for the formation of particularly small features, which are desirable to fit more components or more features of a component onto a small footprint. The wafers and/or components are generally tested to identify any components that do not meet specifications. As noted above, defects affecting component performance can result from the coating process or from the patterning process itself. These two sources of defects can be considered relatively independent sources of potential failure to meet component specifications. Significant efforts to reduce patterning defects are described in published U.S. patent application 2020/0326627 to Jiang et al., entitled "Organometallic Photoresist Developer Compositions and Processing Methods," incorporated herein by reference. The teachings herein can be effective to reduce coating defects.

Particles and other insoluble matter are common contaminants in photoresist solutions, and resist solutions are typically filtered to lower the number of detectable particles in the solution as is described in published U.S. Patent Application 2020-0239498 to Clark et al, (hereinafter the '498 application), entitled "Monoalkyl Tin Trialkoxides and/or Monoalkyl Tin Triamides With Particulate Contamination and Corresponding Methods," incorporated herein by reference. Additional insoluble matter, i.e., defects, can form during handling or deposition of the photoresist and manifest as detectable defects on the wafer. For example, organometallic and metal oxide photoresists can undergo undesired hydrolysis and/or condensation reactions that can lead to particulate formation. In other examples, material from the surfaces that the photoresist comes in contact with, such as filter membranes, tubing, container walls, and the like, can detach to form particles within the solutions. Other forms of particulate generation can occur during the handling of the material, such as from a particle shedding effects due to agitation or abrasive contact between two objects, wherein particles from foreign materials can fall on or into the resist solution.

While not wanting to be limited in theory, during the processing from a container of resist to coating formation, it is believed that water migration into the resist in a closed flow can result in increased defect formation. Thus, while water can be useful to hydrolyze a resist composition to form the radiation patternable coating, water interaction prematurely during transfer to a dispensing nozzle of a coater can result in defect formation. Therefore, it can be desirable to prevent water migration into the fluid transport system delivering the resist in the coater line. Ways to limit water migration include for example replacing or sealing water permeable polymer tubing with more water resistant materials, such as corrosion resistant metal or other materials. Additionally or alternatively, a small dummy flow can be continued in the coater line to avoid resist sitting at a fixed location in the delivery line. In additional or alternative embodiments, a filter can be placed along the resist delivery track, such as a short distance from the spin coater nozzle. The filtration of the resist immediately prior to spin coating can result in very low defect values on the resulting coated wafers. Wafer defects are generally measured using optical measurements. Roughly 90 percent of equipment for evaluating quality of unpatterned wafers for integrated circuit production are sold by KLA-Tencor (Surfscan SP5 and SP7), while additional systems are sold by Hitachi-Hightech (Wafer Surface Inspection System LS) and Applied Materials (SEMVISION™ G7).

While organometallic resists have provided significant advances for EUV patterning to provide for better exploitation of the fine patterning capabilities, the significant shift of chemistries relative to conventional photoresists has introduced some challenges to reach full commercial deployment. The advances described herein provide for a drop in defect rates that correspondingly improve yield of wafers within specification for wafer quality.

The resist processing can be further improved to reduce particle counts and correspondingly improve wafer quality based on lower measured defect rates. Lower particle contamination counts can be obtained at least partly through optimizing the processing described in the '498 application. Further improvement while providing convenience for scaling can be obtain using a dual loop filtration system where the loops are sequential, as exemplified below. The processing structure with two filtration loops presents an improvement over the embodiments suggested in the '498 application. Thus, the organometallic resist entering the second loop is already substantially purified, which allows for improved particle removal in the second loop prior to placing the resist in a container.

Particle measurement obtained in a closed process system prior to placement in a container can be directly comparable and are believed to be generally free of air bubbles and other perturbations that can provide readings from scattering measurements essentially equivalent to particles. Once the resists are placed into containers, subsequent particle measurements for the liquids removed from the containers have significantly greater particles detected. Results suggest that generally these increased particle measurements are substantially due to air bubbles or the like since they do not correlate with defect formation for coatings on the wafers. Nevertheless, additional particle sources can be present following placement in a container, such as particle formation due to contact with the container, particles shedded from a container lid or other foreign source, and/or nucleation of particles resulting from storage.

Organometallic photoresists such as organotin oxide hydroxides have been shown to possess excellent properties as photoresists for use in lithographic photopatterning. Suitable organometallic photoresists include organotin materials as described in U.S. Pat. No. 9,310,684B2 to Meyers et al., entitled "Organometallic Solution Based High Resolution Patterning Compositions," published U.S. patent application 2016/0116839A1 to Meyers et al., entitled "Organometallic Solution Based High Resolution Patterning Compositions and Corresponding Methods," and U.S. Pat. No. 10,228,618B2 entitled "Organotin Oxide Hydroxide Patterning Compositions, Precursors, and Patterning", all of which are incorporated herein by reference. Other organometallic patterning compositions based on various metals are described in published U.S. patent application 2002/0076495 to Maloney et al., entitled "Method of Making Electronic Material," and U.S. Pat. No. 9,372,402B2 to Freedman et al., entitled "Molecular Organometallic Resists for EUV," both of which are incorporated herein by reference. Applicant has developed organotin patterning materials that have been progressed to a high degree, and some of these are the exemplified compositions.

Monoalkyl tin alkoxides and monoalkyl tin amides have been formed having very low metal contamination in the parts per billion range. The tin compositions can be selected to have high EUV absorption such that the compositions can be useful for EUV patterning in semiconductor manufacturing. In particular, monoalkyl tin compositions have been found to provide very effective EUV patterning resists that can be used to form very fine structures. Fractional distillation has been found to be effective for the purification of the compounds with respect to metal impurities. The processing can also be used to separate the monoalkyl tin compounds from polyalkyl tin contaminants. The purified compositions can then be further diluted with semiconductor grade solvents, and optionally others compositions, to form desired patterning products. Additionally or alternatively, improved filtering techniques can also provide low particulate contamination in radiation resist compositions. The purified radiation resist compositions are suitable for patterning of very small features with low patterned product failure rates and high yield.

For semiconductor processing and other microelectronics applications, metal contaminants can be detrimental and can result in product failure and high processing loss rates due to failure of components to meet specifications. For some metal contaminants, the threshold contaminant levels that can be detrimental for semiconductor products can be very low. Therefore, there is considerable motivation to significantly reduce metal contaminants. Radiation based patterning has been the key process technology to form ever shrinking component sizes, and the demand for this shrinkage has pushed radiation based patterning into higher energy radiation regimes, such as extreme ultra violet light and electron beams. To take advantage of the finer patterns available using higher energy radiation, organometallic based radiation resists, especially organotin compounds, have been found with a high level of performance. For processing with organotin compounds, in addition to managing the introduction and removal of the tin, it is desirable to avoid introduction of contamination by other metals. Based on processing developed by Applicant, contaminating metals can be reduced to parts-per-billion by mass levels.

It has been discovered that appropriate purification processing can be used to effectively reduce non-tin metal contamination to very low levels specifically for monoalkyl tin trialkoxides and monoalkyl tin triamides. Based on experience with the application of these compositions for radiation resist materials, it can also be desirable to eliminate polyalkyl tin compounds, and the processing for reducing metal contaminations can also be effective to remove the polyalkyl tin contaminants. In particular, the monoalkyl tin trialkoxides and monoalkyl tin triamides can be purified using fractional distillation using a suitable distillation column and in some embodiments through appropriate selection of the distillation fractions. Corresponding handling of the purified compositions can maintain the high purity of the compositions. Furthermore, the purified compositions can be filtered to remove particulate contaminants that can result in patterning imperfections. Improved filtration can use continuous impeller style pumps to circulate and recirculate the photoresists through semiconductor grade filters to remove particulates. The particulate removal can be verified using in line light scattering measurements.

The use of organometallic tin compositions as photoresists, especially for extreme ultraviolet based patterning, is generally based on monoalkyl tin oxo hydroxo compounds. The oxo hydroxo compounds can be made in solution, or they can be made during and/or subsequent to an in situ coating process involving water based hydrolysis of $RSnX_3$ compounds in which R is an alkyl group and Sn—X is a hydrolysable group. Monoalkyl tin triamides and monoalkyl tin trialkoxides are suitable precursor compounds for forming the monoalkyl tin oxo hydroxo compounds, and monoalkyl tin triamides are suitable precursors for forming monoalkyl tin trialkoxides. Current best practices for using these resist compositions comprise forming a coating of monoalkyl tin trialkoxide, and hydrolyzing the trialkoxide in situ to form the oxo hydroxo compositions with a volatile alcohol by product that readily evaporates. The processing and compositions described herein are generally useful for such previously described processes and compositions as well as for other monoalkyl tin based photoresist patterning processes and compositions beyond the current best practices.

Monoalkyl tin triamides can thus be useful intermediate products in the preparation of organotin photoresists either through their use to synthesize monoalkyl tin trialkoxides or for the deposition and in situ processing to form the monoalkyl tin oxo-hydroxo compositions. The improved purification techniques can be combined with improved synthesis techniques. The improved synthesis techniques and improved distillation approaches are described further in co-pending U.S. patent application Ser. No. 15/950,292 to Edson et al. (hereinafter the '292 application), entitled "Monoalkyl Tin Compounds With Low Polyalkyl Contamination, Their Compositions and Methods," incorporated herein by reference.

The use of alkyl metal organometallic compounds in high performance radiation-based patterning compositions is described, for example, in U.S. Pat. No. 9,310,684 to Meyers et al., entitled "Organometallic Solution Based High Resolution Patterning Compositions," incorporated herein by reference. Refinements of these organometallic compositions for patterning are described in published U.S. patent applications 2016/0116839 A1 to Meyers et al., entitled "Organometallic Solution Based High Resolution Patterning Compositions and Corresponding Methods," and 2017/0102612 A1 to Meyers et al. (hereinafter the '612 application), entitled "Organotin Oxide Hydroxide Patterning Compositions, Precursors, and Patterning," both of which are incorporated herein by reference.

The alkyl tin precursor compositions comprise a group that can be hydrolyzed with water or other suitable reagent under appropriate conditions to form the alkyl tin oxo-hydroxo patterning compositions, which can be represented by the formula $RSnO_{(1.5-(x/2))}(OH)_x$ where $0<x\leq3$. The hydrolysis and condensation reactions that can transform the compositions with hydrolyzable Sn—X groups are indicated in the following reactions:

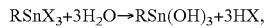

$$RSnX_3 + 3H_2O \rightarrow RSn(OH)_3 + 3HX,$$

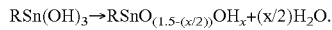

$$RSn(OH)_3 \rightarrow RSnO_{(1.5-(x/2))}OH_x + (x/2)H_2O.$$

If the hydrolysis product HX is sufficiently volatile, in situ hydrolysis can be performed with water vapor during the substrate coating process, but the hydrolysis reaction can also be performed in solution to form the alkyl tin oxo-hydroxo compositions. These processing options are described further in the '612 application.

The monoalkyl tin triamide compositions generally can be represented by the formula $RSn(NR')_3$, where R and R' are independently an alkyl or a cycloalkyl with 1-31 carbon atoms with one or more carbon atoms optionally substituted with one or more heteroatom functional groups, such as groups containing O, N, Si, Ge, Sn, Te, and/or halogen atoms, or an alkyl, or a cycloalkyl further functionalized with a phenyl, or cyano group. In some embodiments, R' can comprise ≤10 carbon atoms and can be, for example, methyl, ethyl, propyl, isopropyl, butyl, t-butyl, isobutyl, or t-amyl. The R group can be a linear, branched, (i.e., secondary or tertiary at the metal-bonded carbon atom), or cyclic hydrocarbyl group. Each R group individually and generally has from 1 to 31 carbon atoms with 3 to 31 carbon atoms for the group with a secondary-bonded carbon atom and 4 to 31 carbon atoms for the group with a tertiary-bonded carbon atom. In particular, branched alkyl ligands can be desirable for some patterning compositions where the compound can be represented as $R^1R^2R^3CSn(NR')_3$, where $R^1$ and $R^2$ are independently an alkyl group with 1-10 carbon atoms, and $R^3$ is hydrogen or an alkyl group with 1-10 carbon atoms. As noted below, this representation of alkyl ligand R is similarly applicable to the other embodiments generally with $R^1R^2R^3CSn(X)_3$, with X corresponding to the trialkoxide or triamide moieties. In some embodiments $R^1$ and $R^2$ can form a cyclic alkyl moiety, and $R^3$ may also join the other groups in a cyclic moiety. Suitable branched alkyl ligands can be, for example, isopropyl ($R^1$ and $R^2$ are methyl and $R^3$ is hydrogen), tert-butyl ($R^1$, $R^2$ and $R^3$ are methyl), tert-amyl ($R^1$ and $R^2$ are methyl and $R^3$ is —CH$_2$CH$_3$), sec-butyl ($R^1$ is methyl, $R^2$ is —CH$_2$CH$_3$, and $R^3$ is hydrogen), neopentyl ($R^1$ and $R^2$ are hydrogen, and $R^3$ is —C(CH$_3$)$_3$), cyclohexyl, cyclopentyl, cyclobutyl, and cyclopropyl. Examples of suitable cyclic groups include, for example, 1-adamantyl (—C(CH$_2$)$_3$(CH)$_3$(CH$_2$)$_3$ or tricyclo(3.3.1.13,7) decane bonded to the metal at a tertiary carbon) and 2-adamantyl (—CH(CH)$_2$(CH$_2$)$_4$(CH)$_2$(CH$_2$) or tricyclo(3.3.1.13,7) decane bonded to the metal at a secondary carbon). In other embodiments hydrocarbyl groups may include aryl or alkenyl groups, for example, benzyl or allyl, or alkynyl groups. In other embodiments the hydrocarbyl ligand R may include any group consisting solely of C and H and containing 1-31 carbon atoms. In summary, some examples of suitable alkyl groups bonded to tin include, for example, linear or branched alkyl (i-Pr ((CH$_3$)$_2$CH—), t-Bu ((CH$_3$)$_3$C—), Me (CH$_3$—), n-Bu (CH$_3$CH$_2$CH$_2$CH$_2$—)), cyclo-alkyl (cyclo-propyl, cyclo-butyl, cyclo-pentyl), olefinic (alkenyl, aryl, allylic), or alkynyl groups, or combinations thereof. In further embodiments suitable R groups may include hydrocarbyl groups substituted with hetero-atom functional groups including cyano, thio, silyl, ether, keto, ester, or halogenated groups or combinations thereof.

The alkyl tin trialkoxide compositions can be represented by the formula $RSn(OR^0)_3$. The alkyl tin trialkoxide can be synthesized from alkyl tin triamide, although other synthesis pathways can be used, such as those described in the '292 application wherein synthesis of monoalkyl tin trialkoxides is achieved from alkyl triamido tin compositions. The alkyl triamido tin compositions can be represented by the formula $RSn(NR''COR''')_3$. The R groups ($R^0$, R'', R''') in the formulas for the alkyl tin trialkoxide and alkyl triamido tin compositions can be the same R groups as summarized above for the alkyl tin triamide compositions, and the corresponding discussion of these R groups above is as if copied in this paragraph in its entirety. The monoalkyl triamido tin compositions are not discussed further herein. For the alkoxide ligands —$OR^0$, the $R^0$ groups can be independently hydrocarbon groups with 1-10 carbon atoms, such as methyl groups, ethyl groups, or the like.

In keeping with the common terminology in this art, "alkyl tin" compounds refer to a broad range of organic ligands with a C—Sn bond, where the ligands are not necessarily directed to moieties based on aliphatic alkanes with a C—H bond replaced with a C—Sn bond. So in some sense alkyl tin can be considered to recite "organo tin" moieties with C—Sn bonds. Similarly, monoalkyl tin moieties refer to compounds with a single C—Sn bond. The discussion above focuses in some detail on monoalkyl tin triamide (organo tin triamide) and monoalkyl tin trialkoxide (organo tin trialkoxide) compounds, which have been found to be very effective precursors for forming radiation patternable coatings, a more general discussion including other hydrolyzable ligands is found in the context of the coating process below, and the teachings herein apply more generally to the broader range of tin compounds with hydrolyzable ligands.

Polyalkyl tin impurity compositions may affect condensation of the coated resist material and contribute to radiation resist outgassing during lithographic processing, which increases the potential for tin contamination of equipment used for film deposition and patterning. Based on these concerns, a significant desire exists to reduce or eliminate the dialkyl or other polyalkyl components of resist compositions. The monoalkyl tin trialkoxide compositions can be desirable constituents in precursor patterning composition solutions since they are amenable to in situ hydrolysis and condensation to form monoalkyl tin oxo-hydroxo compositions with alcohol byproducts that are generally and appropriately volatile for removal commensurate with in situ hydrolysis.

Monoalkyl tin triamide compositions can be directly synthesized with relatively low polyalkyl contaminants using suitable methods described in the '292 application. Furthermore, fractional distillation processes have been found to be effective to remove non-tin metal contaminants and polyalkyl tin contaminants for monoalkyl tin triamides and for monoalkyl tin trialkoxides. The achievement of very low polyalkyl contamination levels is described in detail in published U.S. patent application 2020/0241413 to Clark et al. (hereinafter the '413 application), entitled "Monoalkyl Tin Trialkoxides and/or Monoalkyl Tin Triamides With Low Metal Contamination and/or Particulate Contamination, and Corresponding Methods," incorporated herein by reference. Compositions having a contamination with other metals or metalloid elements of each no more than 50 parts-per-billion (ppb) by mass are described in the '413 application. Compositions having a contamination with other metals or metalloid elements of each no more than 10 ppb or no more than 2.5 ppb are also described in the '413 application.

The resist precursor composition can be conveniently specified based on tin ion molar concentration. The resist precursor compositions can have the values of low non-tin metal contamination as specified in the previous paragraph. In general, the resist precursor solution generally comprises from about 0.0025 M to about 1.4 M tin cation, in some embodiments from about 0.004M to about 1M, in further embodiments from about 0.005 M to about 0.75 M, also in some embodiments from about 0.01M to about 1M, and in additional embodiments from about 0.01 M to about 0.5 M tin cation. A person of ordinary skill in the art will recognize that additional concentration ranges and values within the explicit ranges above are contemplated and are within the present disclosure.

Suitable solvents are described below for the formation of resist precursor coating solutions, and in the examples, 4-methyl-2-pentanol was used as the solvent. Semiconductor grade solvents with metal contamination levels in the parts per trillion are commercially available from Alfa Aesar, Fuji Film, KMG Chemicals (TX, USA), TOK America, Inc., Honeywell Electronic Materials, Taiwan Refine, and other suppliers. Proper handling of the solutions and storage containers and dilution of the monoalkyl tin composition with a suitable semiconductor grade solvent can limit any introduction of undesirable contaminants during further processing.

Ultra-pure solvents are commonly stored and transported in plastic containers made of high-density polyethylene (HDPE), polytetrafluoroethylene (PTFE), or polypropylene (PP). Aicello Corporation CLEANBARRIER™ (CB) bottles are constructed from HDPE and designed to store and transport pure semiconductor grade chemicals with low particle counts and low trace metal concentrations. Photoresists can also be stored in dealkalized glass bottles. Commercial containers are commonly made with soda-lime glass. This glass contains a high concentration of sodium, which solvents and liquids can leach from the glass. A process of dealkalization depletes sodium from the surface of a glass container to reduce sodium leaching.

For the achievement of low defect patternable coatings of the organometallic resists, the monoalkyl tin compositions can be filtered to eliminate particulate contaminants. Improved procedures for performing the filtering are described in detail below. The filtering and evaluation of the filtered composition is performed with an organometallic resist precursor dissolved in solvent. The dilution is generally performed to the concentrations of the resist composition since the desired resist composition is filtered directly and then loaded into a container for storage and transport. Tin concentrations in resist precursor compositions are presented above.

The particulate contamination can be measured using particle measuring equipment. For example, for photoresists generally, Rion Corporation (Japan) sells particle counters based on light scattering, and such a particle counter is used in the Examples below. An appropriately selected particle counter can perform in line particle measurement by sampling a solution from a filtration flow system. The results from the particle measurements are presented in number of particles per milliliter (mL) of fluid. The particular particle counter would have selected ranges of particle size that are measured, and the results in the Examples below provide particle counts at specified size ranges.

The removal of particulates from organometallic photoresists is described in published PCT application WO 2017/163922 to Tsubaki et al. (hereinafter Tsubaki application), entitled (translated) "Active Ray-Sensitive or Radiation-Sensitive Composition, Method for Purifying Active Ray-Sensitive or Radiation-Sensitive Composition, Pattern-Forming Method, and Method for Producing Electronic Device," incorporated herein by reference. The filtering methods in the Tsubaki application were directed to various metal compounds with selected ligands, and exemplified butyl tin oxide hydroxide ($C_4H_9$—SnOOH) in Example 9. Tsubaki does not discuss filtering alkyl metal alkoxides. Improvements in filtering for organometallic resists and in particular alkyl metal alkoxides are described in the '413 application. Filtering processes described herein provide further improvements with the objective of further lowering of unpatterned defect values for wafer resist coatings.

Resist compositions comprising monoalkyl metal trialkoxides and/or monoalkyl tin triamides in an organic solvent at a concentration from about 0.0025M to about 1.4 M and in some embodiments from about 0.01M to about 0.5 M (based on moles tin) can be purified to remove particulates such that the solutions have no more than about 0.5 particles per mL with average sizes greater than 150 nm, in further embodiments no more than about 0.25 particles/mL, and in additional embodiments no more than about 0.2 particle/mL with average sizes greater than 150 nm as determined by light scattering. Using commercially available particle counters, such as a Rion KS-41B Liquid-Borne Particle Sensor with optional capabilities, particles sizes down to 70 nm can be counted using light scattering. Using filtration techniques herein, alkyl metal alkoxides in organic solvents with concentrations from 0.025M to 1.4M and in some embodiments from about 0.05M to about 0.5 M (based on moles tin) can be purified to have particle contaminants of no more than 8.0 particles/mL for particle sizes between 70 nm and 150 nm, in further embodiments no more than 5.0 particles/mL, and in additional embodiments no more than 4.0 particles/mL. A person of ordinary skill in the art will recognize that additional ranges of particle contamination within the explicit ranges above are contemplated and are within the present disclosure.

As noted above, the monoalkyl tin triamides can also be used to synthesize corresponding monoalkyl tin trialkoxides, although the monoalkyl tin trialkoxides can be synthesized using other approaches. In particular, monoalkyl tin trialkoxides can be produced by reacting the corresponding monoalkyl tin triamide with an alcohol. The low polyalkyl tin contaminants in the monoalkyl tin triamides can be carried forward into the product monoalkyl tin trialkoxides, so that the product monoalkyl tin trialkoxides have low dialkyl tin contaminants essentially at the mole percentages described above for the monoalkyl tin triamides. The alcohol is selected to provide the desired alkoxide group such that an alcohol ROH introduces the —OR group as the ligand attached to tin. A list of suitable R groups is provided above and correspondingly relate to the alcohol. Examples are provided below with t-amyl alcohol, but other alcohols can be similarly used to provide the desired —OR alkoxide ligand.

Further processing of the purified monoalkyl tin compositions generally involves dilution of the compositions with an organic solvent. The diluted compositions can be filtered to remove particulates. The filtering can be performed at one or more suitable process points, such as prior to use in a further reaction, prior to placement of a resist composition into a container for storage and/or transport, and/or in a process line via delivery on a commercial wafer track. Improved processing is described herein, which is especially useful for filtering monoalkyl tin trialkoxides.

In some embodiments, the filtering apparatus can be configured for performing repeated filtering of the organometallic composition, such as by configuring the system for recirculation and/or for performing serial filtration. For recirculation of the filtered composition, the container can be fitted with a drain port and a return fill port. A pump or pumps can be used to drive the flow of fluid through the filtration system, and a suitable filter can be used in line to remove small particulates from the fluid. Clean tubing can be used to connect the system with flow between the respective components.

A schematic layout of a filtration system 140 from the '498 application is shown in FIG. 1. The composition to be filtered can be in a container 142 with an outlet 144, an inlet 146 and access port(s) 148. Flow from outlet can be controlled with one or more pumps 150. The flow path then passes through a first filter 152 and optionally additional filter(s) 154. A flow meter 156 can be used to monitor the flow rate through the system. A particle analyzer 158 can be configured to measure particle within the filtered flow. While FIG. 1 shows particle analyzer 158 in line with the flow, other suitable configurations can be used, such as a sampling configuration. Filtered flow can be directed for recirculation through recirculation line 160 connected to inlet 146 of container 142 or for collection through collection line 162 directed to collection container 164. A valve 165 can be used to selectively direct flow to either recirculation line 160 or collection line 162. In some embodiments, valve 166 can be used to divert filtered flow to collection container 168, such as in a recirculation configuration when the particle count drops below a selected value. Flow can be directed through suitable tubing, such as polymer tubing.

Fluid in collection container 164 can be further filtered if desired in either a recirculation configuration or another serial filtering configuration. A recirculation configuration for collection container 164 can be conceived by conceptually reproducing the circular flow loop connected to container 142 comprising pump(s), filter(s), particle analyzer, and other desired components, with these components specifically connected to collection container 164. As depicted in FIG. 1, a second serial filtration configuration is shown. Flow from outlet 170 of collection container 164 can be controlled with one or more pumps 172 that direct flow to one or more filters 174. Flow from filter(s) 174 can be directed past a particle analyzer 176 that can be in line or in a sampling configuration, and a flow meter 178, positioned at a convenient location along the flow path. Filtered flow can be collected in bottle 180. Again, suitable polymer tubing or other suitable flow conduits can be used to direct the flow through the filtration system. Further serial filtering and/or combinations with recirculation and serial filtering can be performed if desired through a repeat of the filtration system. In a filtration system with two or more stages, the filters used for a later stage filtration can be selected to have a finer particle removal capability. For example, a first stage filtration can be performed with a filter rated at a particle size cutoff of 5 nm to 15 nm, and a second stage filtration can be performed with a filter rated at a particle size cut off of 1 nm to 3 nm. In some embodiments, the first stage filtration can involve recirculation, while a second stage is serial.

Figure 2:
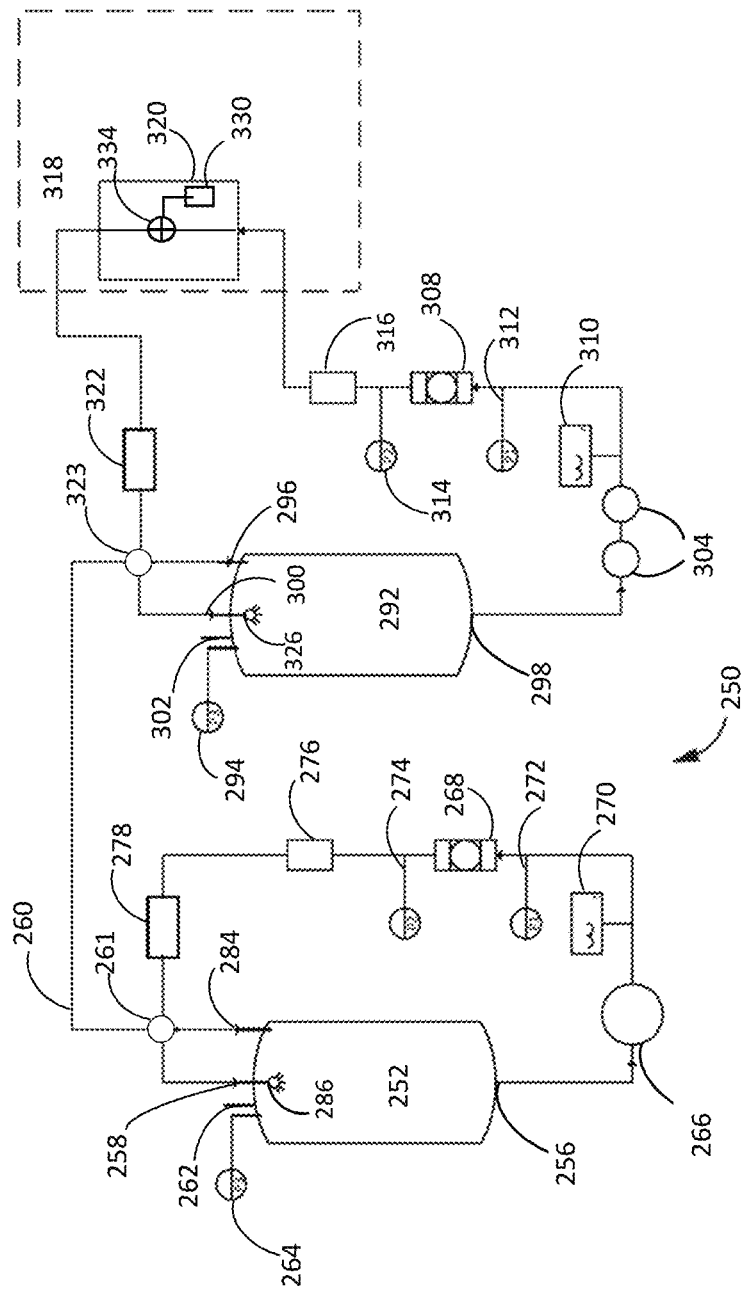
FIG. 2 is a schematic of a dual track resist purification system.

A schematic layout of a dual track resist purification system 250 is shown in FIG. 2. The composition to be filtered can be introduced into container 252 through inlet 284. Container 252 has inlets 258 and 284, outlet 256, and access port(s) 262. In some embodiments access port(s) 262 are used to introduce inert gas, such as argon or nitrogen, into container 252 or to release gases from container 252. Pressure gauge 264 can be used to monitor the pressure in container 252. In some embodiments container 252 can have a capacity of about 55 gallons, although other sizes can be used as desired. In some embodiments container 252 is a mix tank comprising a stirring element and can be used to initially mix precursor compositions and solvent and/or to incorporate flow from inlet 284. In some embodiments, the precursor compositions are tin-based precursor compositions. Flow from outlet 256 can be controlled with one or more pumps 266. In some embodiments pumps 266 are impeller style pumps. The flow passes through first filter 268 and optionally additional filter(s). In some embodiments, suitable filters for first filter 268 are described below. Temperature unit 270 may be used to monitor and/or control the temperature of the flow. In some embodiments, the temperature of the tank is maintained at a constant temperature, generally between about 18° C. and 35° C. Pressure gauges 272 and 274 may be used to monitor the pressure of flow before and after first filter 268. Particle analyzer 276 can be configured to measure liquid particle counts within the filtered flow. While FIG. 2 shows particle analyzer 276 in line with the flow, other suitable configurations can be used, such as a sampling configuration. Flow meter 278 can be used to monitor the flow rate through the first flow loop. Users may select a parameter or parameters upon which the filtered flow is directed at valve 261, generally a three way valve, for recirculation via inlet 284 or for further filtration in a second flow loop via transfer line 260, through appropriate control of valve 261. A parameter may include the number of volume turnovers, calculated as the total volume of fluid that has passed through a selected filter, such as first filter 268, divided by the total volume of fluid in the system. In some embodiments, flow is directed to the second flow loop when the particle count drops below a selected value and/or the volume turnover parameter is above some threshold value. The number of volume turnovers can be at least 5 turnovers, in further embodiments at least about 10 turnovers, in some embodiments at least 15 turnovers, in further embodiments at least 30 volume turnovers, and in additional embodiments at least 45 volume turnovers. A turnover indicates that flow through the filtration loop corresponds to the total volume of resist being processed. A person of ordinary skill in the art will recognize that additional ranges of turnovers within the explicit ranges above are contemplated and are within the present disclosure. Increasing the number of volume turnovers generally results in a decrease in particles, but the incremental improvement generally drops with additional turnovers. Inlet 258 is shown with spray ball 286. In some embodiments inlet 258 and spray ball 286 are used for introducing cleaning fluid into container 252 for use between processing batches. Alternatively, inlet 258 may deliver filtered flow to container 252. Container 252, outlet 256, pump 266, first filter 268, particle analyzer 276, flow meter 278, and inlet 284 are elements of a first filtration or flow loop.

Filtered flow directed to the second flow loop for further filtration via valve 261 flows along transfer line 260, through a valve 323, generally a three way valve, and enters container 292 through inlet 296. Flow can be controlled with one or more pumps 266 In some embodiments pumps 266 are impeller style pumps, such as the pumps described further below. While other configurations can be suitable, in an exemplified embodiment, the first flow loop has one larger capacity impeller style pump, and the second flow loop has two in series impeller style pumps.

Container 292 is shown with inlets 296 and 300, outlet 298, and access port(s) 302. In some embodiments access port(s) 302 are used to introduce argon into container 292 or to release gases from container 292. Pressure gauge 294 can be used to monitor the pressure in container 292. In some embodiments container 292 can have a capacity of about 55 gallons. In some embodiments container 292 is a mix tank and can be used to incorporate flow from inlet 296. Flow from outlet 298 can be controlled with one or more pumps 304. In some embodiments pumps 304 are impeller style pumps. The flow passes through a second filter 308 and optionally additional filter(s). In some embodiments, suitable filters for second filter 308 are described below. The first flow loop and the second flow loop can have equivalent or different filter types. For example, the first flow loop can have a somewhat larger filtration size cutoff, such as 3 nm, relative to the filter for the second flow loop, such as a 1 nm filter. A temperature unit 310 may be used to monitor and/or control the temperature of the flow. Pressure gauges 312 and 314 may be used to monitor the pressure of flow before and after second filter 308. Particle analyzer 316 can be configured to measure particle within the filtered flow. While FIG. 2 shows particle analyzer 316 in line with the flow, other suitable configurations can be used, such as a sampling configuration. The flow is further directed through a cleanroom and into bottling room 318, which can be a cleanroom. Filtered flow may be partially or fully diverted for collection via bottle filler unit 320 or pass through bottle filler unit 320 for further filtering. Flow meter 322 can be used to monitor the flow rate through the system. Filtered flow for recirculation flows through valve 323 to inlet 296 of container 292. Inlet 300 is shown with spray ball 326. In some embodiments inlet 300 and spray ball 326 are used for introducing cleaning fluid into container 292 between processing batches. Alternatively, inlet 300 may deliver filtered flow to container 292. Container 292, outlet 298, pump(s) 304, second filter 308, particle analyzer 316, bottle filler unit 320, flow meter 322, and inlet 296 are elements of a second filtration or flow loop. Bottle filler unit 320 can be a further clean environment with a higher rating than bottling room 318. In the exemplified embodiment described in the Examples below of a dual loop filtration system, bottling room 318 is a cleanroom with a FS209E rating of 1000 (ISO 6), and bottle filler unit 320 is a cleanroom with a FS209E rating of 100 (ISO 5).

In general, the tubing for connecting the components can be polymer tubing, such as polytetrafluoroethylene tubing, which is very chemically inert. At reasonable tubing thicknesses, the tubing may be subject to some water migration. While water migration may lead to some particle formation, this may not be significant due to particle filtration. In some embodiments, the tubing can be replaced with non-water permeable materials, such as metal, but these may be more subject to providing contaminants. Alternatively, polymer tubing can be wrapped with an air jacket or metal foil or coating to mitigate any water migration risk.

Filtered flow may be diverted from the second filtration loop for collection in bottles 330 via branch valve 334. Users may select a parameter or parameters upon which the filtered flow is diverted from the second flow loop for collection. A parameter may include the number of volume turnovers, calculated as the total volume of fluid that has passed through a selected filter, such as second filter 308, divided by the total volume of fluid in the system. In some embodiments, flow is diverted for collection when the particle count drops below a selected value and/or the volume turnover parameter is above some threshold value. In some embodiments, the number of volume turnovers can be at least 5 turnovers, in some embodiments at least 15 turnovers, in further embodiments at least 30 volume turnovers, and in additional embodiments at least 45 volume turnovers. Increasing the number of volume turnovers generally results in a decrease in particles, but the incremental improvement generally drops with additional turnovers. Alternatively or additionally, the measured particle numbers can be used to determine suitability for bottling. In some embodiments, bottling is performed following a measurement of no more than about 10 particles per ml with a size of 70 nm or larger, in further embodiments no more than about 5 particles, in some embodiments no more than about 4 particles, and in additional embodiments no more than 1 particle with a size of 70 nm or greater and no measured particles (<0.05 particles per mL) with a size of 150 nm or larger. A bottle fill tool may be connected to bottle filler unit 320 with suitable polymer tubing or other suitable flow conduits and used to fill bottles 330 in sequence within the cleanroom.

For embodiments in which the container is configured in a closed loop configuration to provide for the recirculation, a lid to the container providing the composition to be filtered can be configured with a plurality of ports. One port can be used for removal of the fluid to be pumped to the filter, another port can be used to deliver the filtered fluid back into the container, and other ports can be used for various additional functions. For example, another port of the container lid can be used to deliver the filtered fluid to a packing container. A specific embodiment of a filtering apparatus is described in more detail in the Examples below.

While generally any one of a variety of pumps can be used to drive the filtration flow, it has been discovered that impeller style pumps provide surprisingly improved filtration performance. While not wanting to be limited by theory, the more even pressures delivered by an impeller style pump are believed to improve the performance of the filter for particulate removal by reducing pressure fluctuations. The improved filtering is confirmed in the Examples where filtering with an impeller style pump is contrasted with a diaphragm style pump using the same filter. Suitable impeller style pumps include in particular magnetic levitation impeller pumps from Levitronix® GmbH (Switzerland). Due to the high viscosity of the monoalkyl tin trialkoxides, two or more Levitronix® pumps can be placed in series to obtain a desired flow rate. The magnetic levitation pumps provide low shear on the liquid during pumping as well as a steady pressure. Flow rates through the system generally depend on the filter selection, pump selection, tubing size, temperature, and pressure, which is influenced by the fluid viscosity.

Filters suitable for resist compositions based on in-line filtering are commercially available. For example, photoresist filters are available from Entegris (e.g., Impact® and Microgard™ UC/UCP lines of filters) and Nihon Pall Co. Ltd (Japan, e.g. PE-Kleen filters and PhotoKlean™ DDF P-Nylon). The rated particle filtration size of the filter can be specified down to <5 nm, >3 nm or >1 nm, but the smaller pore sizes can reduce the flow rate. As described in the Examples, desirable performance is obtained with a filter rated with pore sizes >1 nm. In general, the particle filtration rating can be 50 nm (i.e., removing particles with sizes greater than 50 nm), 25 nm, 10 nm, 5 nm, 3 nm, 2 nm, or 1 nm. A person of ordinary skill in the art will recognize that additional ranges of particle filtration ratings within the explicit ranges above are contemplated and are within the present disclosure.

For particle removal, the purified monoalkyl tin composition can be placed in a clean container equipped for pumping out the composition for filtration. Suitable filtration systems are summarized above. As noted above, various configurations can be used. For recirculation, the composition can be recirculated generally (in terms of volume turnovers) from once to 100 times, in some embodiments from 2 times to 80 times, and in further embodiments from 5 to 65 times. A person of ordinary skill in the art will recognize that additional ranges of turnovers within the explicit ranges above are contemplated and are within the present disclosure. More recirculations can be performed, though suitable performance can typically be achieved in the ranges specified. For serial filtration, the composition can be serially filtered once to 10 times. A person of ordinary skill in the art will recognize that additional ranges of numbers of filtration steps within the explicit ranges above are contemplated and are within the present disclosure. The filtration can be performed prior to placing the radiation sensitive resist composition into a container for shipping and/or in a production line immediately prior to use of the composition for patterning purposes. In any case, the filtration system can be configured to avoid contamination of the radiation resist composition with metal contaminants and/or particulate contaminants. If the filtered compositions are placed in containers for shipping, the containers can be sealed and appropriately shipped to end use facilities, at which appropriately clean processing can be used for transfer of the compositions into process equipment. As noted above, the portion of the processing in the coating and processing line can also be significant for reducing defects. This processing is discussed next.

Line Preparation and Bottle Installation:

During high volume manufacturing, photoresists and other chemicals are typically installed (plumbed) onto a wafer processing track to enable that chemical to be used on demand and/or during programed track recipes. When a new material is desired to be used on the same line it is generally desirable to purge the line of the previous material by flowing a sufficient amount of solvent through the line and/or by flowing a sufficient amount of the new material through the line to ensure that the material being delivered on the wafer is essentially the desired material.

Line preparation can generally be performed by flushing the line with appropriate solvents prior to filling the lines with a desired material. Solvent choice is not particularly limited, but appropriate solvents are generally those that can dissolve with residual material in the line. Appropriate solvents can include nearly any organic solvents, aqueous acids and bases, and combinations thereof. In particular, suitable solvents include, for example, aromatic compounds (e.g., xylenes, toluene), ethers (anisole, tetrahydrofuran), esters (propylene glycol monomethyl ether acetate, ethyl acetate, ethyl lactate), alcohols (e.g., 4-methyl-2-pentanol, 1-butanol, methanol, isopropyl alcohol, 1-propanol), ketones (e.g., methyl ethyl ketone), lactams and lactones (e.g., N-methyl-2-pyrrolidone, butyrolactone), carboxylic acids (e.g., formic acid, acetic acid, oxalic acid, lactic acid), aqueous acids (HCl, $H_2SO_4$, $HNO_3$), aqueous bases (tetramethyl ammonium hydroxide, tetrabutyl ammonium hydroxide), water, mixtures thereof, and the like. In general, solvent selection can be influenced by solubility parameters, volatility, flammability, toxicity, viscosity, and potential chemical interactions with other processing materials or materials of construction. In general, an appropriate solvent can be flowed through the line until passes a desired metric, for example, liquid particle counts or on-wafer defect counts.

After preparing a line for installation of a new material, a new bottle can be installed on the track. In one example of bottle installation, a bottle containing a photoresist solution can be placed into a chemical cabinet and a stinger, i.e., needle or line source, is then submerged into the bottle. The stinger is attached to a line or tubing that allows the resist solution to be delivered to a desired module, for example, a spin coater module, within the track.

While a photoresist is installed on a track, it is also generally desirable to maintain a flow of material through the line throughout the duration of the bottle's lifetime. For times in which resist is not being deposited on a wafer, a flow is typically achieved by using a dummy dispense process wherein material from the installed bottle is dispensed into the coating chamber and/or into the drain line periodically in order to ensure that the material in the line does not stagnate for long periods of time since stagnation can be associated with defect formation possibly due to particle formation from water migration into the tubing. It is common for the tubing and lines in wafer tracks to be constructed from fluorocarbon polymers, such as PTFE, PFA, and the like. While not wanting to be limited by theory, many fluorocarbon polymers are known to exhibit some permeability to, for example, water vapor, which can subsequently react with organometallic, inorganic, and metal oxide photoresists and therefore result in the formation of particles. Other nucleation process that may lead to the generation of particles can arise through other mechanisms.

Nevertheless, limiting the residency time of the material in the line is generally desired. In some embodiments, a dummy dispense can dispense at least about 0.1 mL of material, in other embodiments at least about 0.25 mL of material, in further embodiments at least about 0.5 mL of material, and in additional embodiments at least about 1 mL of material. It can be convenient to pulse the dummy dispense of resist in a selected period during which no active coating is taking place. The frequency of the dummy dispense can occur at least once every 2 hours, in further embodiments at least once every 60 minutes, in some embodiments, at least once every 45 minutes, in other embodiments at least once every 30 minutes. In the exemplified embodiment, 3 mls is pulsed every 20 minutes. While pulsed dummy dispense is convenient for incorporation into a wafer coating track, a continuous flow can be used with the dispense rates from the pulsed flows adjusted to continuous flow rates to achieve overall comparable flows over long time. A person of ordinary skill in the art will recognize that additional ranges of volumes and frequencies are envisioned and are within the scope of the invention. Suitable volumes and dispense frequencies can typically be found by those of ordinary skill in the art through routine experimentation by finding the suitable values for each that give an acceptable balance of defectivity results and material consumption.

Figure 3:
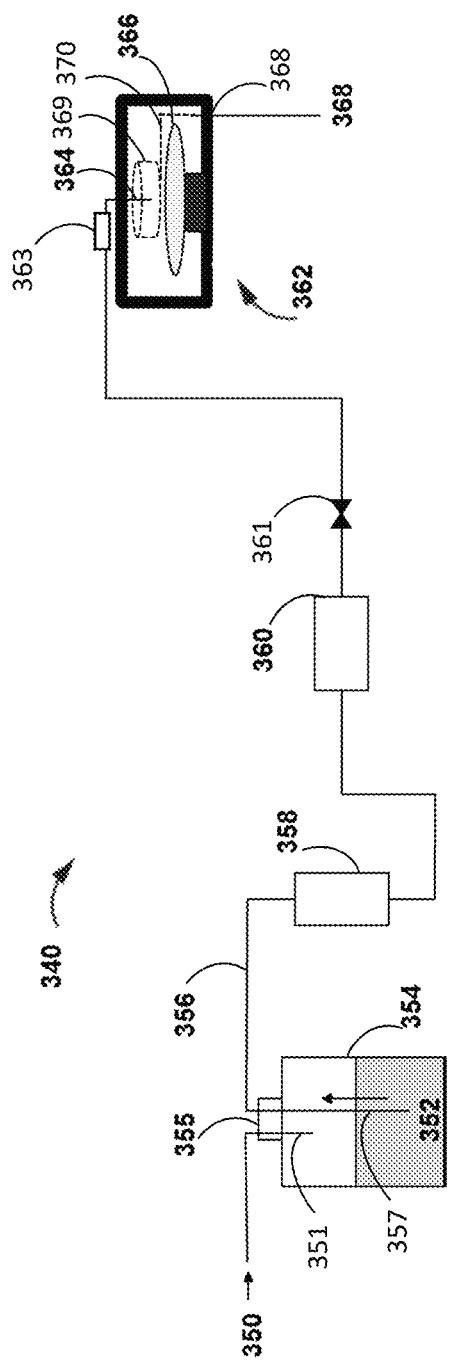
FIG. 3 is a schematic of a wafer track spin coating system.

A schematic layout of wafer track system 340 is shown in FIG. 3. Bottle 354 has lid 355 and contains filtered photoresist solution 352. In some embodiments, filtered photoresist solution 352 in bottle 354 may be prepared via the dual track resist purification system 250 shown in FIG. 2. In the system of FIG. 3, an inert gas 350 is delivered into bottle 354 via flow line 351 or other suitable tap inserted into cap 355 or replacing the cap. In an embodiment, the inert gas 350 is nitrogen. Filtered photoresist solution 352 is removed from bottle 354 via stinger 357, which is attached to photoresist delivery line 356. Wafer track system 340 may include hold-up tank(s) 358 and pump(s) 360 through which filtered photoresist solution 352 is delivered to coating module 362. Control valve 361 can be used to regulate the flow rate of the photoresist solution to coating module 362. Coating module 362 is shown with delivery nozzle 364, drain 368, and wafer 366. Photoresist solution 352 is delivered to wafer 366 through delivery nozzle 364. In some embodiments, photoresist solution 352 passes through filter 363 prior to delivery to wafer 366 through delivery nozzle 364. Drain 368 is provided for removal of excess material such as photoresist solution 352. In some desirable embodiments, pump(s) 360 comprises one or more impeller style pumps as described above to provide more even pressure and reduce particle formation. In some embodiments container 369 is provided to collect initial and/or dummy dispense flow of photoresist solution 352. Container 369 has drain line 370 that connects to drain 368. In some embodiments container 369 is positioned as illustrated in FIG. 3 in the absence of wafer 366 as illustrated. In other embodiments, wafer 366 is absent and delivery nozzle 364 and container 369 may be conveniently positioned laterally, such as positioned above drain 368. In other embodiments, wafer 366 is absent and delivery nozzle 364 may be conveniently positioned laterally or extended, such as positioned above and extended toward drain 368. In such an embodiment container 369 may be absent or may be positioned above drain 368. Wafer track system 340 is generally located in a fabrication facility with a control environment in which temperature and relative humidity are maintained close to selected values to provide for uniformity of the processing. Thus, the ambient is maintained surrounding the wafer processing. For example, the relative humidity can be controlled to be about 45%.

In some embodiments, to ensure that the liquid material being deposited onto the substrate contains sufficiently few particles and/or defects as desired, it can be useful to flow the material through a filter immediately prior to dispensing the material onto the wafer through the use of a point-of-use (POU) filter. The POU filter can be placed at or near the spin coater dispenser nozzle, such as within 1 meter, although the filter can be placed at a desired location along the delivery line to the spin coater. The identity of the POU filter is not particularly limited so long as the filter's materials-of-construction do not interact or react negatively with the material flowing through it, and examples of suitable POU filter types are the same as described above for filtering as prepared resist liquids. Other suitable filter types can be found by those of ordinary skill in the art through routine experimentation and can be obtained from well-known suppliers such as Entegris, Pall, and others. In some examples below, a POU filter was not used for analyzing non-patterned wafer defects in order to provide information on whether the number of defects on wafer are inherent to the material in the bottle. In other examples below, a POU filter was used to demonstrate very low defect coatings.

Deposition of Coatings

A coating material can be formed through deposition and subsequent processing of the precursor solution onto a selected substrate. Using the precursor solutions described herein, some hydrolysis and condensation generally is performed during coating, and may be completed or furthered post coating via subsequent processing steps such as heating in air. A substrate generally presents a surface onto which the coating material can be deposited, and the substrate may comprise a plurality of layers in which the surface relates to an upper most layer. In some embodiments, the substrate surface can be treated to prepare the surface for adhesion of the coating material. Also, the surface can be cleaned and/or smoothed as appropriate. Suitable substrate surfaces can comprise any reasonable material. Some substrates of particular interest include, for example, silicon wafers, silica substrates, other inorganic materials such as ceramic materials, polymer substrates, such as organic polymers, composites thereof and combinations thereof across a surface and/or in layers of the substrate. Wafers, such as relatively thin cylindrical structures, can be convenient, although any reasonable shaped structure can be used. Polymer substrates or substrates with polymer layers on non-polymer structures can be desirable for certain applications based on their low cost and flexibility, and suitable polymers can be selected based on the relatively low processing temperatures that can be used for the processing of the patternable materials described herein. Suitable polymers can include, for example, polycarbonates, polyimides, polyesters, polyalkenes, copolymers thereof and mixtures thereof. In general, it is desirable for the substrate to have a flat surface, especially for high resolution applications. However, in specific embodiments the substrate may possess substantial topography, where the resist coating is intended to fill or planarize features for particular patterning applications.

In general, any suitable solution coating process can be used to deliver the precursor solution to a substrate. Suitable coating approaches can include, for example, spin coating, spray coating, dip coating, knife edge coating, printing approaches, such as inkjet printing and screen printing, and the like. Some of these coating approaches form patterns of coating material during the coating process, although the resolution available currently from printing or the like has a significantly lower level of resolution than available from radiation based patterning as described herein.

In some embodiments, spin coating can be a desirable approach to cover the substrate relatively uniformly, although there can be edge effects. In some embodiments, a wafer can be spun at rates from about 500 rpm to about 10,000 rpm, in further embodiments from about 1000 rpm to about 7500 rpm and in additional embodiments from about 2000 rpm to about 6000 rpm. The spinning speed can be adjusted to obtain a desired coating thickness. The spin coating can be performed for times from about 5 seconds to about 5 minutes and in further embodiments from about 15 seconds to about 2 minutes. An initial low speed spin, e.g. at 50 rpm to 250 rpm, can be used to perform an initial bulk spreading of the composition across the substrate. A back side rinse, edge bead removal step or the like can be performed with water or other suitable solvent to remove any edge bead. A person of ordinary skill in the art will recognize that additional ranges of spin coating parameters within the explicit ranges above are contemplated and are within the present disclosure.

The thickness of the coating generally can be a function of the precursor solution concentration, viscosity and the spin speed for spin coating. For other coating processes, the thickness can generally also be adjusted through the selection of the coating parameters. In some embodiments, it can be desirable to use a thin coating to facilitate formation of small and highly resolved features in the subsequent patterning process. For example, the coating materials after drying can have an average thickness of no more than about 1 micron, in further embodiments no more than about 250 nanometers (nm), in additional embodiments from about 1 nanometers (nm) to about 50 nm, in other embodiments from about 2 nm to about 40 nm and in some embodiments from about 3 nm to about 25 nm. A person of ordinary skill in the art will recognize that additional ranges of thicknesses within the explicit ranges above are contemplated and are within the present disclosure. The thickness can be evaluated using non-contact methods of x-ray reflectivity and/or ellipsometry based on the optical properties of the film. In general, the coatings are relatively uniform to facilitate processing. In some embodiments, the variation in thickness of the coating varies by no more than ±50% from the average coating thickness, in further embodiments no more than ±40% and in additional embodiments no more than about ±25% relative to the average coating thickness. In some embodiments, such as high uniformity coatings on larger substrates, the evaluation of coating uniformity may be evaluated with about a 3 millimeter edge exclusion, i.e., the coating uniformity is not evaluated for portions of the coating within 3 millimeter of the edge, although a 1 centimeter exclusion could be used with similar results. A person of ordinary skill in the art will recognize that additional ranges of coating thickness and coating variation within the explicit ranges above are contemplated and are within the present disclosure.

The coating process itself can result in the evaporation of a portion of the solvent since many coating processes form droplets or other forms of the coating material with larger surface areas and/or movement of the solution that stimulates evaporation. The loss of solvent tends to increase the viscosity of the coating material as the concentration of the species in the material increases. An objective during the coating process can be to remove sufficient solvent to stabilize the coating material for further processing. Reactive species may condense during coating or subsequent heating to forming a hydrolysate coating material.

In general, the coating material can be exposed to, and optionally heated in, the presence of atmospheric moisture prior to radiation exposure to hydrolyse the hydrolysable bonds to the metal in the precursor compositions, and/or further drive off solvent and promote densification of the coating material. The coating material following in situ hydrolysis may generally form a polymeric metal oxo-hydroxo network based on the binding oxo-hydroxo ligands to the metals in which the metals also have some alkyl ligands, or a molecular solid comprised of polynuclear metal oxo/hydroxo species with alkyl ligands.

The hydrolysis/solvent removal process may or may not be quantitatively controlled with respect to precise stoichiometry of the heated coating material and/or specific amounts of solvent remaining in the coating material. Additionally, the formulas and compositions expressed herein may contain some additional water, whether directly bound to Sn, or as hydrogen-bonded component of the network. Empirical evaluation of the resulting coating material properties generally can be performed to select processing conditions that are effective for the patterning process. While heating may not be needed for successful application of the process, it can be desirable to heat the coated substrate to speed the processing and/or to increase the reproducibility of the process and/or to facilitate vaporization of the hydrolysis by products, such as amines and/or alcohols. In embodiments in which heat is applied to remove solvent, the coating material can be heated to temperatures from about 45° C. to about 250° C. and in further embodiments from about 55° C. to about 225° C. The heating for solvent removal can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of heating temperature and times within the explicit ranges above are contemplated and are within the present disclosure. As a result of the heat treatment, hydrolysis, and densification of the coating material, the coating material can exhibit an increase in index of refraction and in absorption of radiation without significant loss of contrast.

A range of $R_nSnX_{(4-n)}$ compounds where n=0, 1, or 2, or combinations thereof, as demonstrated to produce organotin oxide hydroxide photoresists by hydrolysis in solution or in-situ hydrolysis as discussed herein. Useful X ligands include alkylamido and dialkylamido, chloro, alkoxo, or alkynido, siloxo, silylamido, disilylamido, aryloxo, azido, amidato, amidinato, or fluorinated analogues thereof in combination with substituted and unsubstituted hydrocarbyl R groups that include both straight-chain and branched-chain alkyl, cyclo-alkyl, aryl, alkenyl, alkynyl benzyl, and their fluorinated derivatives. Suitable precursors may include, for example, $(CH_3)_3CSn(NMe_2)_3$, $(CH_3)_2CHSn(NMe_2)_3$, $(CH_3)_2(CH_3CH_2)CSn(NMe_2)_3$, $(CH_2)_2CHSn(NMe_2)_3$, $CH_3Sn(NMe_2)_3$, $(CH_2)_3CHSn(NMe_2)_3$, $(CH_2)_4CHSn(NMe_2)_3$, $(C_6H_5)CH_2Sn(NMe_2)_3$, $(C_6H_5)(CH_3)CHSn(NMe_2)_3$, $(C_6H_5)(CH_3)CHSn(NMe_2)_3$, $(CH_3)_2(CN)CSn(NMe_2)_3$, $(CH_3)(CN)CHSn(NMe_2)_3$, or $(CH_3)_3CSn(OtBu)_3$, $(CH_3)_2CHSn(OtBu)_3$, $(CH_3)_2(CH_3CH_2)CSn(OtBu)_3$, $(CH_2)_2CHSn(OtBu)_3$, $CH_3Sn(OtBu)_3$, $(CH_2)_3CHSn(OtBu)_3$, $(CH_2)_4CHSn(OtBu)_3$, $(C_6H_5)CH_2Sn(OtBu)_3$, $(C_6H_5)(CH_3)CHSn(OtBu)_3$, $(C_6H_5)(CH_3)CHSn(OtBu)_3$, $(CH_3)_2(CN)CSn(OtBu)_3$, $(CH_3)(CN)CHSn(OtBu)_3$ or others known to those skilled in the art. Additionally, one or more precursor compounds with n=0 such as $Sn(NMe_2)_4$, or $Sn(OtBu)_4$ may be reacted sequentially or concurrently with the organotin-containing precursors to alter the R:Sn ratio in the film to achieve desirable patterning attributes. Above, a more general discussion of suitable R groups is found in the discussion of organo tin trialkylamides (alkylamido groups) and organo tin trialkoxides (alkyloxo groups), and these R groups can be similarly applicable to the more general hydrolyzable groups discussed here.

Analysis of Defectivity

Non-patterned defectivity can generally assessed by measuring how many particles are observed on or within a deposited layer. For the analysis of non-patterned defects, the wafer is generally analyzed after deposition of the photoresist coating. Measurement of non-patterned wafer defects can be accomplished by using commercially available tools designed for the task, for example a Surfscan SP5 tool manufactured by KLA Tencor. For some measurements, which utilize optical scattering methods to measure defects, different wavelengths and intensities used by the optical source can translate into different measurement sensitivities for a range of defect sizes. It is generally desirable to employ laser conditions that result in the highest sensitivities without negatively affecting the photoresist, for example, by inducing undesirable photo damage.

With respect to specific defect measurements on an unpatterned wafer with an organometallic radiation patternable composition, the defect measurements can be referenced relative to a Surfscan SP5 tool operated in high sensitivity mode, with a maximum laser power setting of 2.5%, with a 0.048 μm defect size cutoff, and with the spatial analysis setting turned on to filter out noise. A person of ordinary skill in the art will be able to generalize these specific setting on this tool in order to make equivalent measurements on other tools, such as later generations of the same product. In some embodiments, the number of defects measured with a 3 millimeter edge exclusion, can be no more than about 1 defect per square centimeter, in further embodiments no more than about 0.8 defects per square centimeter, in additional embodiments no more than about 0.7 defects per square centimeter, and in other embodiments, no more than about 0.5 defects per square centimeter. A person of ordinary skill in the art will recognize that additional ranges of defects per area within the specific ranges above are contemplated and are within the present disclosure.

EXAMPLES

Example 1: Filtration Systems with Impeller or Diaphragm Style Pumps

This example demonstrates that a filtration system with impeller style pumps is more efficient and effective at lowering particle counts of an organometallic photoresist solution than a filtration system with diaphragm pumps.

In this Example, comparable filtering systems were assembled to examine the effect of pump style on particle counts of an organometallic photoresist solution. For both systems, the organometallic photoresist solution was a 0.044M (based on tin concentration) solution of t-BuSn(Ot-amyl)$_3$ in 4-methyl-2-pentanol, prepared as described in Example 2 of the '498 application cited above. Filtration of the monoalkyl tin trialkoxide solution began immediately after dilution.

Liquid particle counts were monitored during filtration with an in-line RION KS-41B laser system, which includes a syringe sampler (KZ-31W) and controller (KE-40B1). The system quantifies particle counts in select channel sizes via light scattering methods to sizes as small as 70 nm. The final, filtered material was bottled in a laminar flow hood into Aicello CB bottles.

Part A: Impeller Pumps

Figure 4:
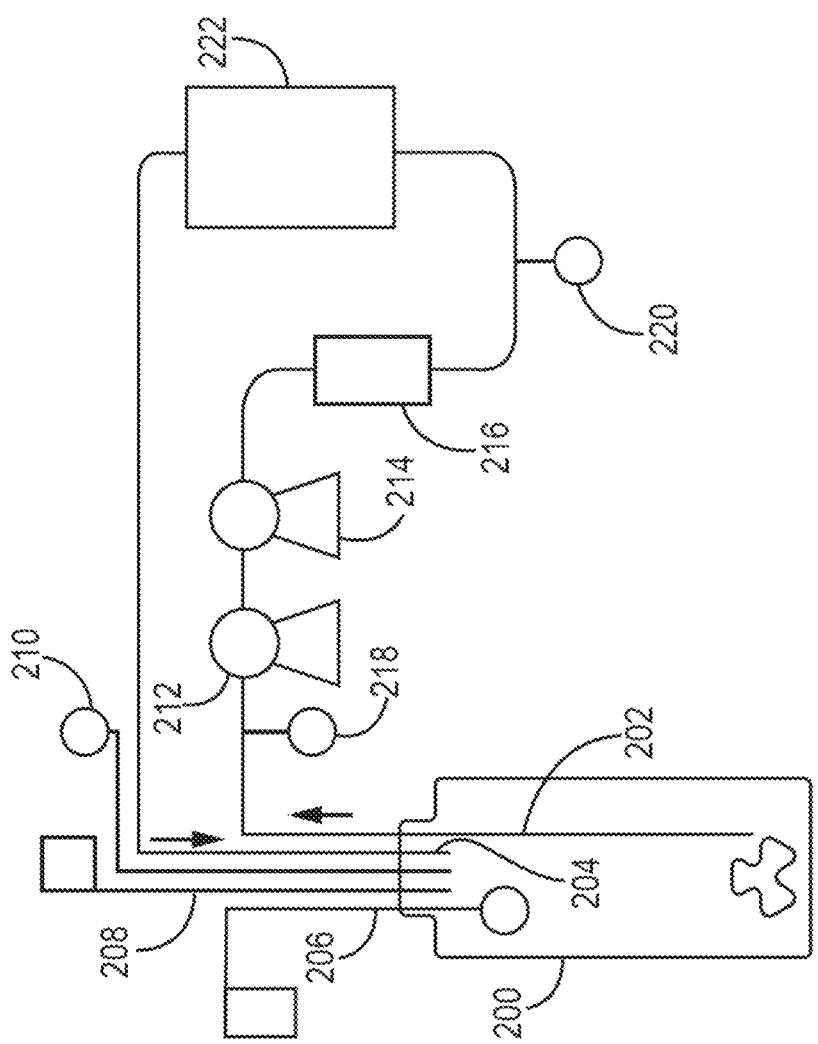
FIG. 4 is a schematic of a specific exemplified filtration system.

The filtration system with impeller pumps is shown schematically in FIG. 4. The mixing tank system 200 contains 5 connection ports at the top of the tank. These ports allow for the following: filtration via recirculation (ports 202, 204), tank cleaning via spray ball (port 206), argon injection (port 208), and headspace pressure monitoring (port 210). The filtration loop consists of two magnetic levitation impeller pumps 212, 214 in series, a temperature probe, a filter 216, pressure transducers 218 and 220, before and after filter 216, respectively, and a particle counting manifold 222. Suitable clean tubing connects the components. A 5 nm Entegris Microgard™ UC filter was used.

The solution was recirculated for one day to achieve 17 volumetric turnovers through the filter. Particle counts for the 70, 150, and 200 nm channels are 3.80, 0.24, and 0.12 per mL, respectively. Table 1 summarizes counts at all channels.

TABLE 1

| Channel | 70 | 80 nm | 90 | 100 nm | 150 nm | 200 nm | 250 nm | 300 | 400 nm | 500 |
|---|---|---|---|---|---|---|---|---|---|---|
| Particles/mL | 3.8 | 1.44 | 0.92 | 0.68 | 0.24 | 0.12 | 0.08 | 0 | 0 | 0 |

The filtration using the impeller pump was very effective at removal of particulates down to small sizes. The smallest channel (70 nm) showed the most particles at 3.8. The particle count decreased with particle size. No particulates of size 300 nm to 500 nm were detected.

Part B: Diaphragm Pumps

The filtration system with diaphragm pumps was similar to the system shown schematically in FIG. 4 with the exception of a 20 L NowPak container equipped with a recirculation cap instead of the mixing tank system 200 and an electric diaphragm pump (Cole-Parmer PTFE-Diaphragm pump, Model #7090-42) instead of the two magnetic levitation impeller pumps. A 5 nm Entegris Microgard™ UC filter was used.

The solution was recirculated for approximately two days to achieve 28 volume turnovers through the filter. Particle counts for the 70, 150, and 200 nm channels are 34.2, 2.40, and 1.44 per mL, respectively. Table 2 summarizes counts at all channels.

TABLE 2

| Channel Size | 70 nm | 80 nm | 90 nm | 100 nm | 150 nm | 200 nm | 250 nm | 300 nm | 400 nm | 500 nm |
|---|---|---|---|---|---|---|---|---|---|---|
| Particles/mL | 34.24 | 13.32 | 9.8 | 7.35 | 2.40 | 1.44 | 0.75 | 0.52 | 0.36 | 0.28 |

The smallest channel (70 nm) showed the most particles at 34.24, which is about 9 times the number of particles measured for the solution filtered with the impeller pumps. The particle count decreased with particle size as with the impeller pumps, however, in the case of the diaphragm pump filtration system, the largest particulates (300 nm to 500 nm) remained in the solution after filtering.

Comparison of the data in Table 1 with that in Table 2 shows that filtration with the impeller pumps was more effective than filtration with the diaphragm pump. Particle counts at each size channel were lower for the system with the impeller pumps. The largest size particles (300 nm to 500 nm) were not observed in the solution filtered with the system with impeller pumps. The sum of the particles at all channels was 7.28 for the impeller pump system and 70.48 for the diaphragm pump system. The results for the impeller pump system were collected after 17 volumetric turnovers through the filter while the results for the diaphragm pump system were from 28 volumetric turnovers through the filter.

Example 2: Filtration Loop

This example demonstrates particle removal resulting from filtration with a filtration loop.

Part A: Preparation of Photoresist Precursor Solution A

A liquid blend of 20 wt % MeSn(OtAm)$_3$ and 80 wt % tBuSn(OtAm)$_3$ was prepared in a 4 L container within a glovebox. The blend was then dispensed into an inert canister via an argon pressure apparatus to provide approximately 3.50 kg of tin material in the canister. An additional canister was filled with 4-methyl-2-pentanol (FujiFilm) and mixed with the highly purified water to provide a solvent solution with a selected water content. Each canister was then connected to a controlled dispense system, leading to a mixing tank for the particular filtration system.

Bulk 4-methyl-2-pentanol was introduced into the mixing tank. The water concentration of the bulk 4-methyl-2-pentanol was measured. Based on the measurement, a controlled amount of the 1.5 wt % water solvent solution was added to the bulk 4-methyl-2-pentanol to achieve a 4-methyl-2-pentanol batch solvent having a desired water content from 200 ppm to 2000 ppm. The overall water content of the batch solvent was measured using a KF titration unit. The use of a uniform amount of water in formulating the resists is described in published U.S. patent application 2019/0391486 to Jiang et al., entitled "Stable Solutions of Monoalkyl Tin Trialkoxides and Their Hydrolysis and Condensation Products," incorporated herein by reference.

After the desired water content of the solvent was met, the blend of tin material was charged to the mixing tank using inert argon gas.

Part B: Purification and Bottling of Photoresist Precursor Solution A

Immediately after dilution, filtration of a batch of photoresist precursor solution A with the resist purification system shown schematically in FIG. 4 was begun. The purification system is described essentially in Example 1, Part A, although a 20 gallon mixing tank was used in place of a 55 gallon mixing tank. The resist was charged into the mixing tank with bulk solvent (4-methyl-2-pentanol) from a container using a clean dip tube and argon pressure. Water was added with a syringe to reach the target solvent water content. For this example, a 1 nm Entegris Microgard™ UC filter was used. Prior to performing the filtration cycling, the filter was cleaned by flushing with clean solvent until the flush solvent had a Sn concentration of <10 ppm as measured by ICP-MS.

The photoresist precursor solution was recirculated through the filtration loop until about 40 volumetric turnovers through the filter was achieved. The period of recirculation was two days.

Liquid particle counts (LPC) were monitored during filtration with an in-line RION KS-41B laser system, which includes a syringe sampler (KZ-31 W) and controller (KE-40B1). Table 3 shows liquid particle counts for each channel for the in-line photoresist precursor solution A after the single loop filtration described above.

TABLE 3

| Particle | 70 nm | 150 nm | 200 nm |
|---|---|---|---|
| Counts/mL | 1.5 | 0.0 | 0.0 |

The filtration using a filtration loop was very effective at removal of particulates. Only the smallest channel (70 nm) had measurable particulate levels. No particulates in the 150 nm or the 200 nm channels were detected. The total average particle counts for the in-line filtered photoresist precursor solution A in the three channels was less than 1.5 counts/ml.

After the single loop filtration and LPC measurement described above, filtered photoresist precursor solution A was bottled into 1-gallon CLEANBARRIER™ bottles manufactured by Aicello in an argon glovebox environment. Following bottling, liquid particle counts were measured for the bottled, filtered photoresist precursor solution A using a RION KS-41B laser system, syringe sampler, and a controller. Table 4 shows the average liquid particle counts in the bottle for each channel, with the average calculated from 10 measurements each spaced 2 minutes apart.

TABLE 4

| Particle Size | 70 nm | 150 nm | 200 nm |
|---|---|---|---|
| Counts/mL | 35.4 | 5.72 | 2.36 |

The liquid particle counts for each channel were higher for the solution in the bottle than the in-line solution after filtration. There were also particulates detected in the 150 nm and the 200 nm channels. The total average particle counts for the bottled, filtered photoresist precursor solution A in the three channels was about 44 counts/ml. It is believed that the significant increase in measured "particles" was likely at least in part and probably to a significant degree due to air bubbles generated during the bottling process.

Example 3: Sequential Filtration Loops

This example demonstrates improved particle removal resulting from filtration with two sequential filtration loops.

Prior to charging the mixing container, the system was sealed and purged with inert gas such that the system remained sealed from the ambient throughout the filtration process. Immediately after dilution, filtration of a batch of photoresist precursor solution A prepared according to Example 2 was begun with the dual track resist purification system shown schematically in FIG. 2. In the first filtration loop, first filter 268 was an 1 nm Entegris Microgard™ UC filter. The photoresist precursor solution was recirculated through the first filtration loop until about 44 volumetric turnovers through the first filter was achieved. Then the solution was transferred into container 292 and a second filtration by recirculation through the second filtration loop was performed. In the second filtration loop, second filter 308 was a 1 nm Entegris Microgard™ UC filter. The photoresist precursor solution was recirculated through the second filtration loop until 38 volumetric turnovers through the second filter was achieved.

Liquid particle counts (LPC) were monitored during filtration with an in-line RION KS-41B laser system, which includes a syringe sampler (KZ-31 W) and controller (KE-40B1). Table 5 shows liquid particle counts for each channel for the in-line photoresist precursor solution A after the double loop filtration described above.

TABLE 5

| Particle | 70 nm | 150 nm | 200 nm |
|---|---|---|---|
| Counts/mL | 0.24 | 0.0 | 0.0 |

The filtration using two sequential filtration loops was very effective at removal of particulates. Only the smallest channel (70 nm) had measurable particulate levels. No particulates in the 150 nm or the 200 nm channels were detected. The total average particle counts for the in-line filtered photoresist precursor solution A in the three channels was 0.24 counts/ml.

After the double loop filtration and LPC measurement described above, filtered photoresist precursor solution A was bottled into 1-gallon CLEANBARRIER™ bottles manufactured by Aicello in a class 100 cleanroom environment using a bottling machine, manufactured by Nagata (Model #NUCFC-1S) equipped with an argon injection nozzle. Following bottling, liquid particle counts were measured for the bottled, filtered photoresist precursor solution A using a RION KS-41B laser system, syringe sampler, and a controller. Table 6 shows the average liquid particle counts in the bottle for each channel, with the average calculated from 10 measurements each spaced 2 minutes apart.

TABLE 6

| Particle Size | 70 nm | 150 nm | 200 nm |
|---|---|---|---|
| Counts/mL | 22.3 | 2.64 | 0.24 |

The liquid particle counts for each channel were higher for the solution in the bottle than the in-line solution after filtration. There were also particulates detected in the 150 nm and the 200 nm channels. The total average particle counts for the bottled, filtered photoresist precursor solution A in the three channels was less than 26 counts/ml.

Comparing the results of this example to the results of Example 2, the in-line particulate counts were 1.5 counts/ml versus 0.24 counts/ml or about 625% lower for the sequential filtration method. The bottled, filtered resist particulate counts were 44 counts/ml versus 26 counts/ml or about 170% lower for the sequential filtration method. The results also show that lower in-line particle counts are related to lower particle counts after bottling.

Example 4: Low Defect Coatings

This example demonstrates forming photoresist coatings with low counts of non-patterned wafer (NPW) defects.

Unless otherwise noted, different batches of photoresist precursor solution A prepared according to Example 2 were used to prepare the coatings in this example. Each coating was formed by spin coating the respective precursor solution at 1394 rpm to form a coating having a target dry thickness of 22 nm+/−1.0 nm.

Analysis of NPW defects was performed on a KLA Tencor SURFSCAN SP5 instrument that was configured in dark field inspection mode to count all defects of size 48 nm and greater with the exception of a 1 cm edge exclusion. An SP5 protocol was used in the NPW defect analysis and is described in the specification.

Part A: Coating of [Commercial] Organometallic Photoresists on a SOKUDO Track

In Part A, the organometallic photoresists analyzed were manufactured by Inpria Corp. and are identified as Sample 1, Sample 2 (prepared from a 10 wt % iPrSn(OtAm)$_3$+90 wt % tBuSn(OtAm)$_3$ precursor solution), and Sample 3 (prepared from a iPrSn(OtAm)$_3$ precursor solution). Installation of the photoresists was done on a SOKUDO™ coating track without a filter. After verifying line cleanliness, a 1-gallon bottle of photoresist was installed on the track. Following installation, 1 L of resist solution was purged through the line before deposition of films. Films were deposited on clean and bare 300 mm silicon wafers by spin coating at 1800 rpm for 20 seconds. The coated wafers were then baked at 100° C. for 60 seconds prior to analysis.

Analysis of NPW defects was performed and the results for the three different organometallic photoresist coatings are shown in Table 7. Table 7 also shows calculated defect density based on a measurement area of 679 cm$^2$.

TABLE 7

| Resist Name | Defects >48 nm | Defects per sq. cm |
|---|---|---|
| Sample 3 | 287 | 0.42 |
| Sample 2 | 327 | 0.48 |
| Sample 1 | 45 | 0.07 |

The results indicate that low defect counts can be achieved for a range of organometallic photoresist composition.

Part B: Coating of Bottled, Filtered Photoresist Precursor Solution A with a TEL Track In Part B, a bottled, filtered photoresist solution A prepared according to Example 3 was coated onto wafers using the TEL CLEAN TRACK™ LITHIUS Pro™ Z coating track illustrated in FIG. 3 without filter 363 or container 369. After verifying line cleanliness, a 1-gallon bottle of photoresist was installed on the track. Following installation, aliquots of 1 L to 1.5 L of resist solution was purged through the line before deposition of films. Films were deposited on clean and bare 300 mm silicon wafers by spin coating at 1800 rpm for 20 seconds. The coated wafers were then baked at 100° C. for 60 seconds prior to analysis.

Analysis of NPW defects was performed and the results for three duplicate wafers is shown in Table 8. Table 8 also shows calculated defect density based on a measurement area of 679 cm$^2$. An average of 213 defects per wafer was measured.

TABLE 8

| Wafer # | Defects >48 nm | Defects per sq. cm |
|---|---|---|
| 1 | 223 | 0.33 |
| 2 | 210 | 0.31 |
| 3 | 206 | 0.30 |
| Avg: | 213 | 0.31 |

Part C: Coating of Bottled, Filtered Photoresist Precursor Solution A with a TEL Track In Part C, a bottled, filtered photoresist precursor solution A prepared according to Example 2 was coated onto wafers using the TEL CLEAN TRACK™ LITHIUS Pro™ Z coating track illustrated in FIG. 3 but without filter 363 or container 369. After verifying line cleanliness, a 1-gallon bottle of photoresist was installed on the track. Following installation, aliquots of 1 L to 1.5 L of resist solution was purged through the line before deposition of films. Films were deposited on clean and bare 300 mm silicon wafers by spin coating at 1800 rpm for 20 seconds. The coated wafers were then baked at 100° C. for 60 seconds prior to analysis.

Analysis of NPW defects was performed and the results for three duplicate wafers is shown in Table 9. Table 9 also shows calculated defect density based on a measurement area of 679 cm$^2$. An average of 357 defects per wafer was measured.

TABLE 9

| Wafer # | Defects >48 nm | Defects per sq. cm |
|---|---|---|
| 1 | 360 | 0.53 |
| 2 | 361 | 0.53 |
| 3 | 349 | 0.51 |
| Avg: | 357 | 0.53 |

The results from Parts B and C show that lower particle counts of bottled photoresist solution provide lower coating defects. Thus, lower in-line liquid particle counts are related to lower coating defects.

Part D: Coating of Bottled, Filtered Photoresist Precursor Solution A with a Filtered TEL Track Line In Part D, a bottled, filtered photoresist solution A was filtered with the dual track resist purification system according to Part B of Example 3. Different batches of solution (1U, 2U, 3U, and 4F) were each coated onto multiple wafers using the TEL CLEAN TRACK™ LITHIUS Pro™ Z coating track illustrated in FIG. 3. Batches 1U, 2U, and 3U were coated onto wafers without filter 363 or container 369. Batch 4F was coated onto wafers after installation of a 1 nm Entegris Microgard™ UC filter at filter 363. After verifying line cleanliness, a 1-gallon bottle of photoresist was installed on the track. Following installation, aliquots of 1 L to 1.5 L of resist solution was purged through the line before deposition of films. Films were deposited on clean and bare 300 mm silicon wafers by spin coating at 1800 rpm for 20 seconds. The coated wafers were then baked at 100° C. for 60 seconds prior to analysis.

Analysis of NPW defects was performed and the average number of defects per wafer for each batch is shown in Table 10. Table 10 also shows calculated average defect density based on a measurement area of 679 cm$^2$.

TABLE 10

| Batch | # of wafers measured | Avg. Defects >48 | Avg. Defects per sq. |
|---|---|---|---|
| 1U | 6 | 159 | 0.23 |
| 2U | 3 | 213 | 0.31 |
| 3U | 3 | 137 | 0.20 |
| 4F | 3 | 78 | 0.11 |

The average NPW defects for the wafers coated with batches 1U-3U was about 170 defects per wafer. The average NPW defects for the wafers coated with batch 4F was 78 defects per wafer. Providing a filter near the delivery nozzle of a coating track line reduced the NPW coating defects by a factor of 2 or more. This example shows that coupling a filter near the delivery nozzle of a wafer track line with double loop filtration of the coating solution can provide coatings with less than 100 non-patterned wafer defects per wafer.

Part E: Coating of Bottled, Filtered Photoresist Precursor Solution A with a Filtered TEL Track Line In Part E, a bottled, filtered photoresist solution A was filtered with the dual track resist purification system according to Part B of Example 3. Six different batches of solution A (A-F) were each coated onto wafers using the TEL CLEAN TRACK™ LITHIUS Pro™ Z coating track illustrated in FIG. 3 but without container 369. Filter 363 was a 5 nm Entegris Impact® 8G Series Photochemical Filter. After verifying line cleanliness, a 1-gallon bottle of photoresist was installed on the track. Following installation, aliquots of 1 L to 1.5 L of resist solution was purged through the line before deposition of films. Films were deposited on clean and bare 300 mm silicon wafers by spin coating at 1800 rpm for 20 seconds. The coated wafers were then baked at 100° C. for 60 seconds prior to analysis.

Analysis of NPW defects was performed and the average number of defects per wafer for each sample is shown in Table 11. Table 11 also shows calculated defect density based on a measurement area of 679 cm$^2$.

TABLE 11

| Batch | Defects >48 nm | Defects per sq. cm |
|---|---|---|
| A | 78 | 0.11 |
| B | 64 | 0.09 |
| B | 40 | 0.06 |
| B | 39 | 0.06 |
| B | 30 | 0.04 |
| C | 44 | 0.06 |
| D | 48 | 0.07 |
| D | 96 | 0.14 |
| E | 86 | 0.13 |
| E | 39 | 0.06 |
| E | 68 | 0.10 |
| F | 66 | 0.10 |
| Avg: | 58 | 0.09 |

The average NPW defects was 58 defects per wafer, with no wafers having more than 100 defects. This example shows consistently low NPW defects can be achieved by coupling a filter near the delivery nozzle of a wafer track line with double loop filtration of the coating solution.

Additional Inventive Concepts

1. A method for forming an organometallic resist composition with low particle contamination, the method comprising:
    circulating an organometallic resist composition from a first mixing container with an inlet and an outlet over a first filtration loop using an impeller style pump through a first filter to remove particulate contaminants to form a first filtered composition;
    directing the first filtered composition to a second filtration loop comprising a second mixing container;
    circulating the first filtered composition within the second filtration loop using an impeller style pump through a second filter to remove particulate contaminants to form a second filtered composition until the second filtered composition reaches a purification parameter comprising particle concentration below a designed level, volumetric transfers through the filter above a designed level, or a combination thereof;
    wherein particle concentration is measured in-line in a closed system substantially free of air bubbles;

placing filtered organometallic resist composition into a container within a clean room, wherein flow is directed from a branch valve along the second filtration loop; and sealing the container within the clean room.

2. The method of inventive concept 1 wherein the second filtered composition has a particle concentration measured by light scattering with a size of at least 70 nm below 10 particles per mL.

3. The method of inventive concept 1 wherein the second filtered composition has a particle concentration measured by light scattering with a size of at least 70 nm below 4 particles per mL.

4. The method of inventive concept 1 wherein the number of volume transfers through the first filtration loop and the number of volume transfers through the second filtration loop is independently from 2 to 100.

5. The method of inventive concept 1 wherein the first filter and/or the second filter are semi-conductor grade filters having <5 nm exclusion size.

6. The method of inventive concept 1 wherein the first filtration loop and/or the second filtration loop further comprise one or more additional filters and or one or more additional impeller style pumps.

7. The method of inventive concept 1 wherein the container is made of high-density polyethylene (HDPE), polytetrafluoroethylene (PTFE), or polypropylene (PP).

8. The method of inventive concept 1 wherein the first mixing container and/or the second mixing container are provided with argon.

9. The method of inventive concept 1 wherein the organometallic resist composition comprises a monoalkytin trialkoxide, a monoalkyl tin triamide, or combinations thereof in an organic solvent at a concentration from about 0.0025M to about 1.4 M based on the tin.

10. An apparatus for removing particles from an organometallic resist composition, the apparatus comprising:
  a. a first flow loop comprising a mixing container with an inlet and an outlet, a first impeller style pump, a first filter, and tubing connecting the elements in a closed loop configured for the first impeller style pump to direct flow through the first filter to remove particulate contaminants along a path from the inlet to the outlet;
  b. a second flow loop comprising a mixing container with an inlet and an outlet, a second impeller style pump, a second filter, and tubing connecting the elements in a closed loop configured for the second impeller style pump to direct flow through the second filter to remove particulate contaminants along a path from the inlet to the outlet;
  c. a connecting line comprising a valve and flow tubes configured to provide flow between the first flow loop and the second flow loop;
  d. a dispensing line connected to the second flow loop comprising a valve and flow tubes configured to dispense filtered resist composition from the second flow loop within a clean room.

11. The apparatus of inventive concept 10 further comprising the dispensing line connected to a bottle filler unit within a bottling room within the clean room, wherein the bottling room has an FS209E rating of at least 1000 and the clean room has an FS209E rating of at least 100.

12. The apparatus of invention concept 10 wherein the first flow loop and the second flow loop further comprising a gas inlet into the container, an in-line particle analyzer, and a flow meter.

13. A composition comprising a solvent and an organo tin composition with a tin concentration from about 0.005M to about 0.5M and having no more than about 4 particles per mL with a particle size of at least about 70 nm, as measured in a closed system substantially free of air bubbles.

14. The composition of inventive concept 13 wherein the solvent comprises an organic solvent and the organo tin composition comprises a monoalkyl tin trialkoxide represented by the formula)RSn(OR$^O$)$_3$, a monoalkyl tin triamide represented by the formula RSn(NR')$_3$, or a combination thereof, wherein R is an alkyl group or a cycloalkyl group with 1-31 carbon atoms with one or more carbon atoms optionally substituted with one or more heteroatom functional groups containing O, N, Si, Ge, Sn, Te, and/or hydrogen atoms or a combination thereof or an alkyl group or a cycloalkyl group with 1-31 carbon atoms further functionalized with a phenyl or cyano group or a combination thereof.

and wherein the R' and the R$^O$ groups are independently hydrocarbon groups with 1-10 carbon atoms.

15. The composition of inventive concept 14 wherein R comprises methyl (CH$_3$—), ethyl (CH$_3$CH$_2$—), isopropyl (CH$_3$CH$_3$HC—), t-butyl ((CH$_3$)$_3$C—), t-amyl (CH$_3$CH$_2$(CH$_3$)$_2$C—), sec-butyl (CH$_3$(CH$_3$CH$_2$)CH—), neopentyl ((CH$_3$)$_3$CCH$_2$—), cyclohexyl, cyclopentyl, cyclobutyl, benzyl, allyl or cyclopropyl, or a combination thereof and wherein R$^O$ comprises one or more branched alkyl ligands.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understood that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated.

What is claimed is:

1. A wafer structure comprising a substrate and a radiation sensitive organometallic coating having an average thickness of no more than 100 nm and no more than about 1 defect per square centimeter with a defect size of greater than 48 nm, evaluated with a 3 mm edge exclusion, wherein the radiation sensitive organometallic coating comprises a monoalkyl tin composition and is formed by depositing a hydrolysable precursor composition comprising a hydrolysable tin bond and no more than about 10 particles per mL with a particle size of at least about 70 nm, and wherein the wafer structure has a smooth top surface, wherein the radiation sensitive organometallic coating, when fully hydrolyzed, comprises a composition represented by the formula RSnO$_{(1.5-(x/2))}$(OH)$_x$ where $0 < x \leq 3$, wherein R is an organic ligand with 1-31 carbon atoms, with a carbon atom bonded to Sn and with one or more carbon atoms optionally substituted with one or more heteroatom functional groups.

2. The wafer structure of claim 1 comprising a silicon wafer, a silica substrate, a ceramic material, a polymer substrate, composites thereof or combinations thereof across a surface and/or in layers of the substrate.

3. The wafer structure of claim 1 comprising a silicon wafer.

4. The wafer structure of claim 1 wherein the radiation sensitive organometallic coating comprises a plurality of R groups of different chemical structure.

5. The wafer structure of claim 1 wherein R is an alkyl group or cycloalkyl group having 1-10 carbon atoms.

6. The wafer structure of claim 1 wherein R is a branched alkyl ligand represented by $R^1R^2R^3C-$, where $R^1$ and $R^2$ are independently an alkyl group with 1-10 carbon atoms, and $R^3$ is hydrogen or an alkyl group with 1-10 carbon atoms.

7. The wafer structure of claim 1 wherein R comprises methyl ($CH_3-$), ethyl ($CH_3CH_2-$), isopropyl ($CH_3CH_3HC-$), t-butyl (($CH_3)_3C-$), t-amyl ($CH_3CH_2(CH_3)_2C-$), sec-butyl ($CH_3(CH_3CH_2)CH-$), neopentyl (($CH_3)_3CCH_2-$), cyclohexyl, cyclopentyl, cyclobutyl, benzyl, allyl or cyclopropyl.

8. The wafer structure of claim 1 wherein the radiation sensitive organometallic coating has an average thickness of no more than 50 nm.

9. The wafer structure of claim 1 having no more than about 0.5 defects per square centimeter with a defect size of greater than 48 nm, evaluated with a 3 mm edge exclusion.

10. The wafer structure of claim 1 having no more than about 0.2 defects per square centimeter with a defect size of greater than 48 nm, evaluated with a 3 mm edge exclusion.

11. The wafer structure of claim 1 wherein the coating has a non-tin metal contamination of no more than about 50 ppb and no more than 2 weight percent polyalkyl tin oxide hydroxide contamination.

12. The wafer structure of claim 1 wherein the hydrolysable precursor composition comprises a composition represented by the formula $RSnX_3$, wherein X is a hydrolyzable ligand, where R is an hydrocarbyl ligand with a carbon bonded to Sn.

13. The wafer structure of claim 1 wherein the hydrolysable precursor composition is hydrolyzed during and/or after depositing the precursor composition on the substrate.

14. The wafer structure of claim 1 wherein the radiation sensitive organometallic coating comprises a polymeric metal oxo-hydroxo network.

15. The wafer structure of claim 1 wherein the radiation sensitive organometallic coating has no more than 2 weight percent polyalkyl tin oxide hydroxide contamination.

16. The wafer structure of claim 1 wherein the radiation sensitive organometallic coating has an average thickness from about 1 nm to about 50 nm.

17. The wafer structure of claim 1 wherein the hydrolysable precursor composition is deposited under conditions to limit water contact in a delivery line between a container comprising the hydrolysable precursor composition and a delivery nozzle.

18. The wafer structure of claim 17 wherein the delivery line from the container to the delivery nozzle is rinsed first with solvent and then with a quantity of resist that is purged prior to the depositing.

19. The wafer structure of claim 17 wherein the delivery line comprises a filter near the delivery nozzle.

20. The wafer structure of claim 1 wherein the depositing comprises spin coating.

* * * * *